United States Patent
Cho et al.

(10) Patent No.: US 12,058,830 B2
(45) Date of Patent: Aug. 6, 2024

(54) ELECTRONIC DEVICE INCLUDING STRUCTURE FOR PREVENTING FRACTURE OF FLEXIBLE PRINTED CIRCUIT BOARD

(71) Applicant: Samsung Electronics Co., Ltd., Suwon-si (KR)

(72) Inventors: Sujin Cho, Suwon-si (KR); Jungchul An, Suwon-si (KR); Woosung Chun, Suwon-si (KR); Seungki Choi, Suwon-si (KR); Hyunju Hong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 225 days.

(21) Appl. No.: 17/837,716

(22) Filed: Jun. 10, 2022

(65) Prior Publication Data
US 2023/0048823 A1 Feb. 16, 2023

Related U.S. Application Data

(63) Continuation of application No. PCT/KR2022/007083, filed on May 17, 2022.

(30) Foreign Application Priority Data

Aug. 10, 2021 (KR) .................. 10-2021-0105237

(51) Int. Cl.
*H05K 5/06* (2006.01)
*G06F 1/16* (2006.01)
(Continued)

(52) U.S. Cl.
CPC .......... *H05K 5/069* (2013.01); *G06F 1/1652* (2013.01); *G06F 1/1681* (2013.01); *H01R 35/02* (2013.01);
(Continued)

(58) Field of Classification Search
CPC ............ H05K 1/14; H05K 1/147; H05K 1/18; H05K 1/181; H05K 5/0086; H05K 5/0226;
(Continued)

(56) References Cited

U.S. PATENT DOCUMENTS 10,838,458 B1 * 11/2020 Park ..................... H04M 1/185
11,184,980 B2    11/2021 An et al.
(Continued)

FOREIGN PATENT DOCUMENTS

KR   10-2012-0115018 A   10/2012
KR   10-2016-0024151 A   3/2016
(Continued)

OTHER PUBLICATIONS

International Search Report dated Aug. 18, 2022, issued in International Application No. PCT/KR2022/007083.

*Primary Examiner* — Tuan T Dinh
(74) *Attorney, Agent, or Firm* — Jefferson IP Law, LLP

(57) ABSTRACT

Provided is an electronic device including a first housing, a second housing, a flexible housing including a hinge structure, a first printed circuit board disposed in the first housing, a second printed circuit board disposed in the first housing, laminated on one surface of the first printed circuit board facing a second direction and including a connector on one surface facing the second direction, a flexible printed circuit board connected with the connector, extending from the second housing through the hinge structure to the first housing, a rib supporting the first printed circuit board, disposed between the first printed circuit board and a first surface, including a through hole through which part of the flexible printed circuit board passes, extending in the second direction from one end, and at least one sealing member sealing a space between the through hole and part of the flexible printed circuit board.

20 Claims, 26 Drawing Sheets

(51) Int. Cl.
  *H01R 35/02* (2006.01)
  *H04M 1/02* (2006.01)
  *H01R 12/79* (2011.01)
  *H05K 1/14* (2006.01)
  *H05K 1/18* (2006.01)
  *H05K 5/00* (2006.01)
  *H05K 5/02* (2006.01)

(52) U.S. Cl.
  CPC ........... *H04M 1/0214* (2013.01); *H01R 12/79* (2013.01); *H05K 1/147* (2013.01); *H05K 1/18* (2013.01); *H05K 5/0086* (2013.01); *H05K 5/0226* (2013.01); *H05K 2201/10037* (2013.01); *H05K 2201/10189* (2013.01)

(58) Field of Classification Search
  CPC ......... H05K 5/069; H05K 2201/10037; H05K 2201/10189; H04M 1/0214; H04M 1/0216; H04M 1/0268; H04M 1/0277; H04M 1/185; G06F 1/652; G06F 1/681
  USPC .................. 361/679.06–679.9, 679.16, 361/679.26–679.28, 749, 755, 759
  See application file for complete search history.

(56) References Cited

U.S. PATENT DOCUMENTS

| | | | |
|---|---|---|---|
| 11,276,916 B2 | 3/2022 | Kim et al. | |
| 11,528,349 B2 | 12/2022 | Kim et al. | |
| 2014/0111954 A1* | 4/2014 | Lee | H04M 1/0268 361/749 |
| 2015/0049275 A1* | 2/2015 | Posner | G02F 1/1368 361/679.28 |
| 2018/0324964 A1* | 11/2018 | Yoo | F16C 29/02 |
| 2020/0162596 A1* | 5/2020 | Kim | H05K 1/028 |

FOREIGN PATENT DOCUMENTS

| | | |
|---|---|---|
| KR | 10-2020-0057236 A | 5/2020 |
| KR | 10-2020-0092545 A | 8/2020 |
| KR | 10-2020-0101116 A | 8/2020 |

* cited by examiner

ELECTRONIC DEVICE INCLUDING STRUCTURE FOR PREVENTING FRACTURE OF FLEXIBLE PRINTED CIRCUIT BOARD

CROSS-REFERENCE TO RELATED APPLICATION(S)

This application is a continuation application, claiming priority under § 365(c), of an International application No. PCT/KR2022/007083, filed on May 17, 2022, which is based on and claims the benefit of a Korean patent application number 10-2021-0105237, filed on Aug. 10, 2021, in the Korean Intellectual Property Office, the disclosure of which is incorporated by reference herein in its entirety.

TECHNICAL FIELD

This disclosure relates to an electronic device with a structure for preventing damage to a flexible printed circuit board. More particularly, the disclosure relates to a scheme for optimizing an arrangement of a connector and the flexible printed circuit board while maintaining the function of the electronic device.

BACKGROUND ART

An electronic device may be exposed to moisture introduced from outside the electronic device due to increased outdoor activities, such as leisure sports. For the convenience of electronic products with a waterproof function even in a daily life, there is an increased need for waterproofing of electronic devices. For implementation of such a waterproof function, the electronic device may use a waterproof tape wrapping around its major electronic components to prevent moisture from permeating from the outside.

The above information is presented as background information only to assist with an understanding of the disclosure. No determination has been made, and no assertion is made, as to whether any of the above might be applicable as prior art with regard to the disclosure.

DISCLOSURE

Technical Problem

While the state of the art electronic device is recently designed to perform multiple functions on one device, its internal accommodating space is more reduced owing to the current trend of more thinning of the electronic device. Due to the compact arrangement of various electronic components within a limited accommodation space, it would be more difficult for a designer to arrange a connector and a flexible printed circuit board connected to the connector. Therefore, there is a need for a scheme for optimizing the arrangement of the connector and the flexible printed circuit board while maintaining the function of the electronic device.

Aspects of the disclosure are to address at least the above-mentioned problems and/or disadvantages and to provide at least the advantages described below. Accordingly, an aspect of the disclosure is to provide an electronic device with a structure for preventing damage to a flexible printed circuit board.

The technical problems to be addressed in this document are not limited to those described above, and other technical problems not mentioned herein will be clearly understood by those having ordinary knowledge in the art to which the disclosure belongs, from the following description.

Additional aspects will be set forth in part in the description which follows and, in part, will be apparent from the description, or may be learned by practice of the presented embodiments.

Technical Solution

In accordance with an aspect of the disclosure, an electronic device is provided. The electronic device comprises a first housing including a first surface facing a first direction and a second surface facing a second direction opposite to the first direction, a second housing including a third surface facing the first direction and a fourth surface facing the second direction, a hinge structure configured to provide an unfolded state in which the first surface and the third surface face the same direction or a folded state in which the first surface and the third surface face each other, by rotatably connecting the first housing and the second housing with respect to a folding axis, a first printed circuit board within the first housing, a second printed circuit board within the first housing laminated on one surface of the first printed circuit board facing the second direction and including a connector on one surface facing the second direction, a flexible printed circuit board extending from the second housing to the first housing through the hinge structure and being connected with the connector, a rib supporting the first printed circuit board, disposed between the first printed circuit board and the first surface and including a through hole through which a part of the flexible printed circuit board passes and which extends in the second direction from one surface of the rib, and at least one sealing member sealing a space between the through hole and the part of the flexible printed circuit board, wherein a first distance from one surface of the sealing member facing the second direction to the one surface of the first printed circuit board is longer than a second distance from the one surface of the sealing member to one surface of the second printed circuit board facing the second direction.

In accordance with another aspect of the disclosure, an electronic device is provided. The electronic device comprises a first housing including a first surface facing a first direction and a second surface facing a second direction opposite to the first direction, a second housing including a third surface facing the first direction and a fourth surface facing the second direction, a hinge structure configured to provide an unfolded state in which the first surface and the third surface face the same direction or a folded state in which the first surface and the third surface face each other, by rotatably connecting the first housing and the second housing with respect to a folding axis, a printed circuit board within the first housing including a first connector on one surface of the printed circuit board facing the second direction, a flexible printed circuit board extending from the second housing through the hinge structure to the first housing, and including a second connector connected to the first connector, a rib supporting the printed circuit board, being disposed between the first printed circuit board and the first surface and including a through hole through which the flexible printed circuit board passes, the through hole extending in the second direction from one surface of the rib, and at least one sealing member sealing a space between the through hole and the flexible printed circuit board, wherein the flexible printed circuit board includes an extension part extending at a distance from the first connector in a third direction perpendicular to the second direction toward an edge of the printed circuit board in the second housing, and the second connector disposed between the extension part and the first connector, bending from the extension part, and wherein a distance from the one surface of the rib to the extension is longer than an extending distance of the through hole from the one surface of the rib.

In accordance with another aspect of the disclosure, an electronic device is provided. The electronic device comprises a first housing including a first surface facing a first direction and a second surface facing a second direction opposite to the first direction, a second housing including a third surface facing the first direction and a fourth surface facing the second direction, a hinge structure configured to provide an unfolded state in which the first surface and the third surface face the same direction or a folded state in which the first surface and the third surface face each other, by rotatably connecting the first housing and the second housing with respect to a folding axis, a printed circuit board disposed within the first housing, including a first portion, a second portion having ductility and extending along the folding axis from an end of an edge of the first portion close to the folding axis about which the first housing and the second housing are folded, and having a width narrower than the width of the first portion, a third portion extending from an end of the second portion along the folding axis with the width of the second portion, and a first connector disposed on one surface of the third portion facing the second direction, a flexible printed circuit board including a second connector connected to the first connector and extending from the second housing through the hinge structure to the first housing, a rib supporting the printed circuit board, being disposed between the printed circuit board and the first surface and including a through hole through which the flexible printed circuit board passes, the through hole extending in the second direction from one surface of the rib, and at least one sealing member sealing a space between the through hole and a portion of the flexible printed circuit board, and wherein a distance from the one surface of the supporting member to an area in which the flexible printed circuit board is located on the first connector is longer than a length of the through hole from the one surface of the rib.

Advantageous Effects

An electronic device with the structure capable of preventing damage to the flexible printed circuit board by minimizing the difference in between a height of the sealing member and a coupling height of the connector of the printed circuit board for connection with the flexible printed circuit board provided from a non-waterproof area can minimize bending of the flexible printed circuit board in a section in which the flexible printed circuit board extends toward the connector of the printed circuit board. Minimizing bending of the flexible printed circuit board makes it possible to reduce damage in the extended section of the flexible printed circuit board.

Other aspects, advantages, and salient features of the disclosure will become apparent to those skilled in the art from the following detailed description, which, taken in conjunction with the annexed drawings, discloses various embodiments of the disclosure.

DESCRIPTION OF DRAWINGS

The above and other aspects, features, and advantages of certain embodiments of the disclosure will be more apparent from the following description taken in conjunction with the accompanying drawings, in which.

MODE FOR INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
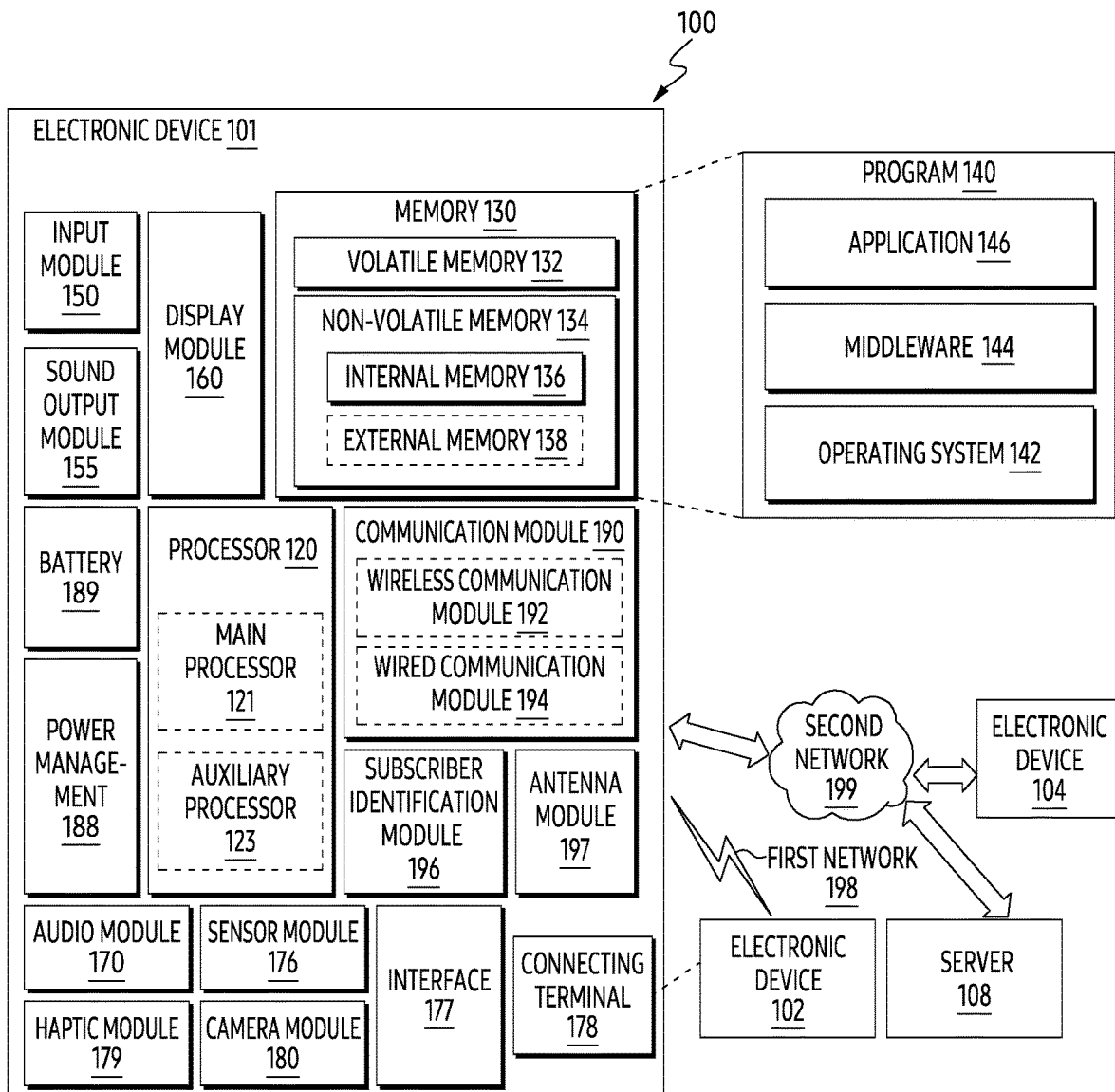
FIG. 1 is a block diagram of an electronic device in a network environment according to an embodiment of the disclosure.

FIG. 1 is a block diagram of an electronic device in a network environment according to an embodiment of the disclosure.

Referring to FIG. 1, an electronic device 101 in a network environment 100 may communicate with an external electronic device 102 via a first network 198 (e.g., a short-range wireless communication network), or at least one of an external electronic device 104 or a server 108 via a second network 199 (e.g., a long-range wireless communication network). According to an embodiment of the disclosure, the electronic device 101 may communicate with the external electronic device 104 via the server 108. According to an embodiment of the disclosure, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments of the disclosure, at least one of the components (e.g., the connecting terminal 178) may be omitted from the electronic device 101, or one or more other components may be added in the electronic device 101. In some embodiments of the disclosure, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment of the disclosure, as at least part of the data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an embodiment of the disclosure, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment of the disclosure, the auxiliary processor 123 (e.g., an image signal processor or a communication processor) may be implemented as part of another component (e.g., the camera module 180 or the communication module 190) functionally related to the auxiliary processor 123. According to an embodiment of the disclosure, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment of the disclosure, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment of the disclosure, the display module 160 may include a touch sensor adapted to detect a touch, or a pressure sensor adapted to measure the intensity of force incurred by the touch.

The audio module 170 may convert a sound into an electrical signal and vice versa. According to an embodiment of the disclosure, the audio module 170 may obtain the sound via the input module 150, or output the sound via the sound output module 155 or a headphone of an external electronic device (e.g., an external electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and generate an electrical signal or data value corresponding to the detected state. According to an embodiment of the disclosure, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the external electronic device 102) directly (e.g., wiredly) or wirelessly. According to an embodiment of the disclosure, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the external electronic device 102). According to an embodiment of the disclosure, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment of the disclosure, the haptic module 179 may include, for example, a motor, a piezoelectric element, or an electric stimulator.

The camera module 180 may capture a still image or moving images. According to an embodiment of the disclosure, the camera module 180 may include one or more lenses, image sensors, image signal processors, or flashes.

The power management module 188 may manage power supplied to the electronic device 101. According to one embodiment of the disclosure, the power management module 188 may be implemented as at least part of, for example, a power management integrated circuit (PMIC).

The battery 189 may supply power to at least one component of the electronic device 101. According to an embodiment of the disclosure, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the external electronic device 102, the external electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment of the disclosure, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a $5^{th}$ generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a $4^{th}$ generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to address, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the external electronic device 104), or a network system (e.g., the second network 199). According to an embodiment of the disclosure, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1ms or less) for implementing URLLC.

The antenna module 197 may transmit or receive a signal or power to or from the outside (e.g., the external electronic device) of the electronic device 101. According to an embodiment of the disclosure, the antenna module 197 may include an antenna including a radiating element including a conductive material or a conductive pattern formed in or on a substrate (e.g., a printed circuit board (PCB)). According to an embodiment of the disclosure, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may be transmitted or received between the communication module 190 and the external electronic device via the selected at least one antenna. According to an embodiment of the disclosure, another component (e.g., a radio frequency integrated circuit (RFIC)) other than the radiating element may be additionally formed as part of the antenna module 197.

According to various embodiments of the disclosure, the antenna module 197 may form a mmWave antenna module. According to an embodiment of the disclosure, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, commands or data may be transmitted or received between the electronic device 101 and the external electronic device 104 via the server 108 coupled with the second network 199. Each of the external electronic devices 102 or 104 may be a device of the same type as, or a different type, from the electronic device 101. According to an embodiment of the disclosure, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment of the disclosure, the external electronic device 104 may include an internet-of-things (IoT) device. The server 108 may be an intelligent server using machine learning and/or a neural network. According to an embodiment of the disclosure, the external electronic device 104 or the server 108 may be included in the second network 199. The electronic device 101 may be applied to intelligent services (e.g., a smart home, a smart city, a smart car, or healthcare) based on 5G communication technology or IoT-related technology.

Figure 2A:
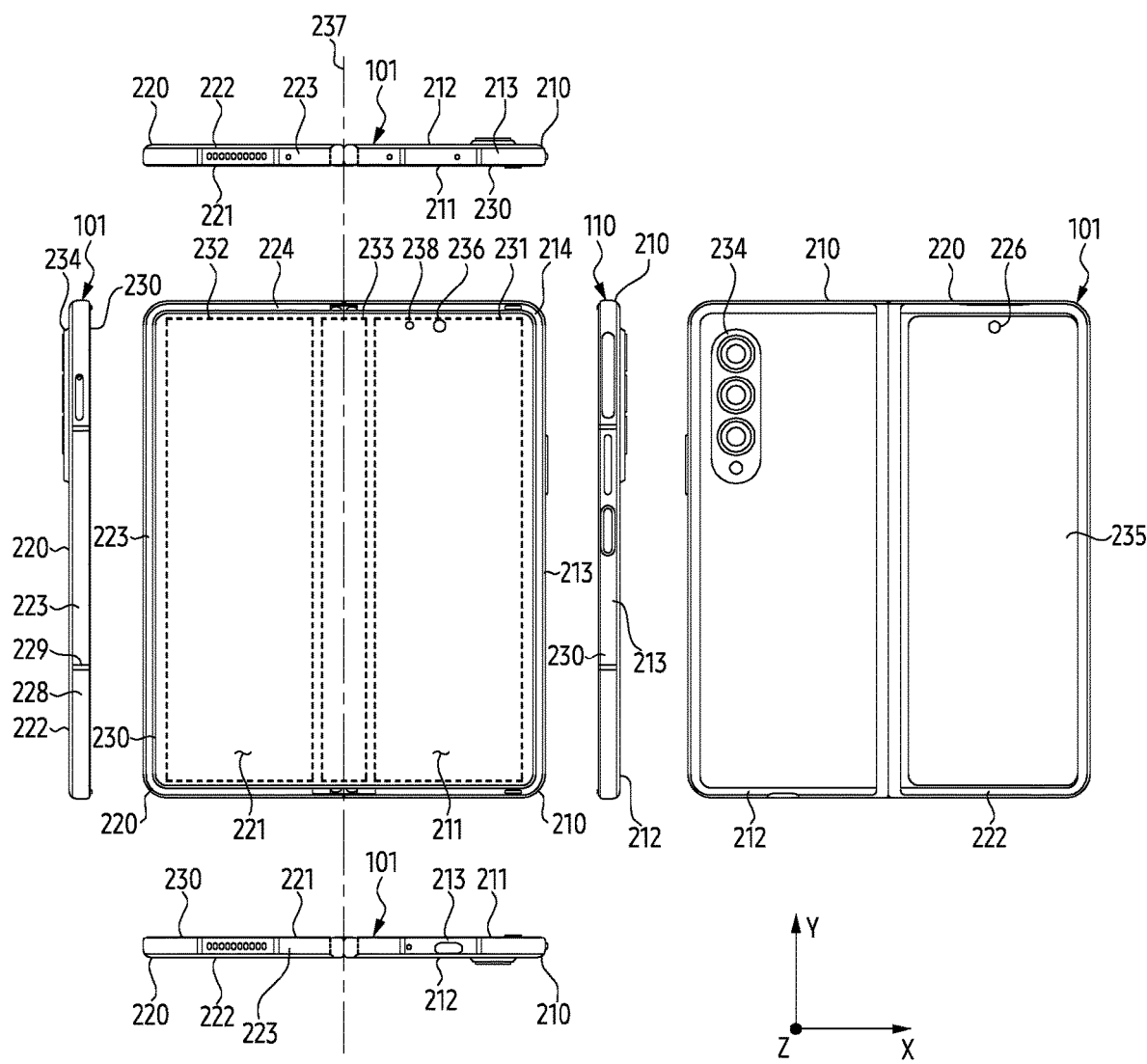
FIG. 2A illustrates an unfolded state of an electronic device according to an embodiment of the disclosure.
Figure 2B:
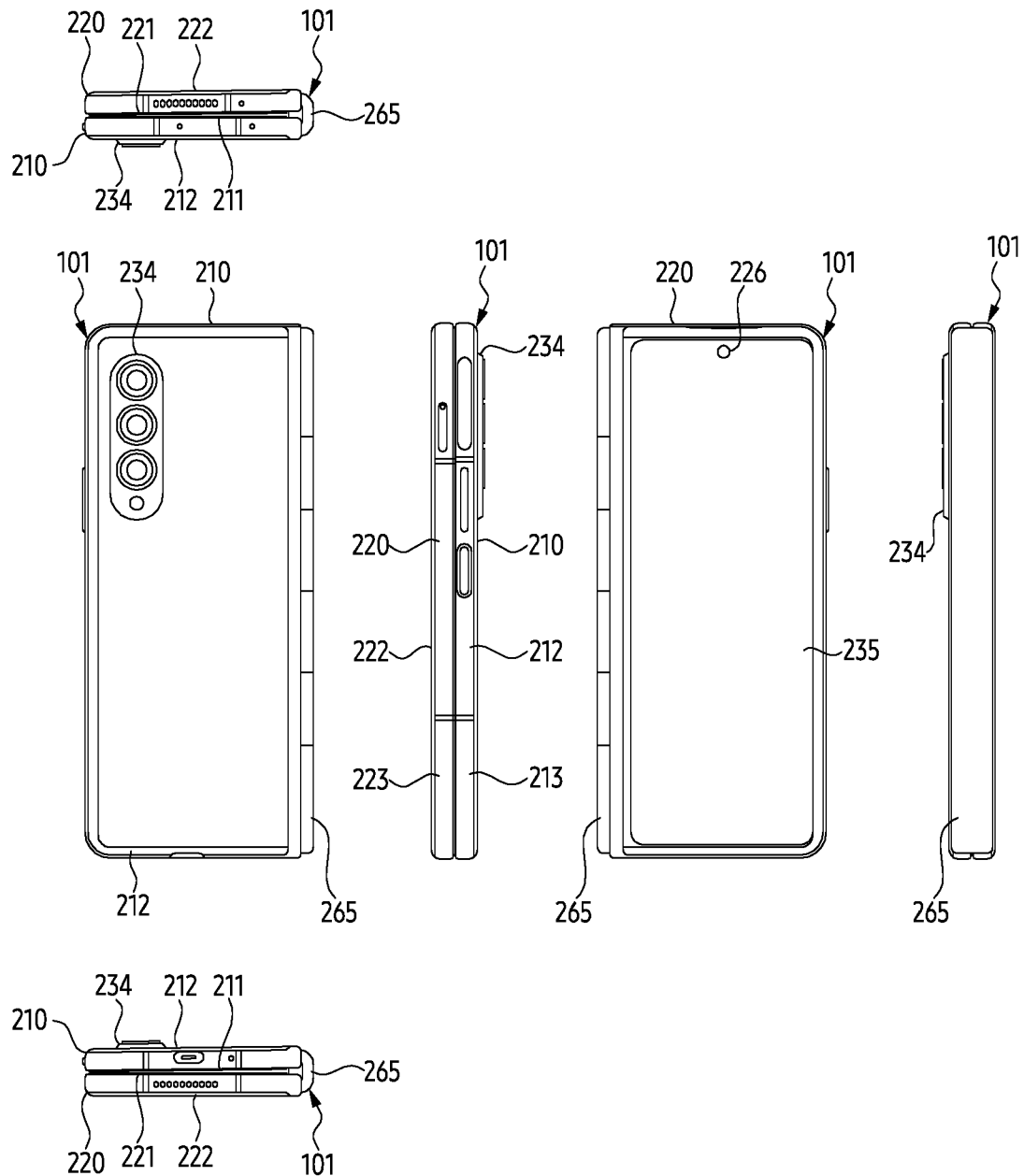
FIG. 2B illustrates a folded state of an electronic device according to an embodiment of the disclosure.
Figure 2C:
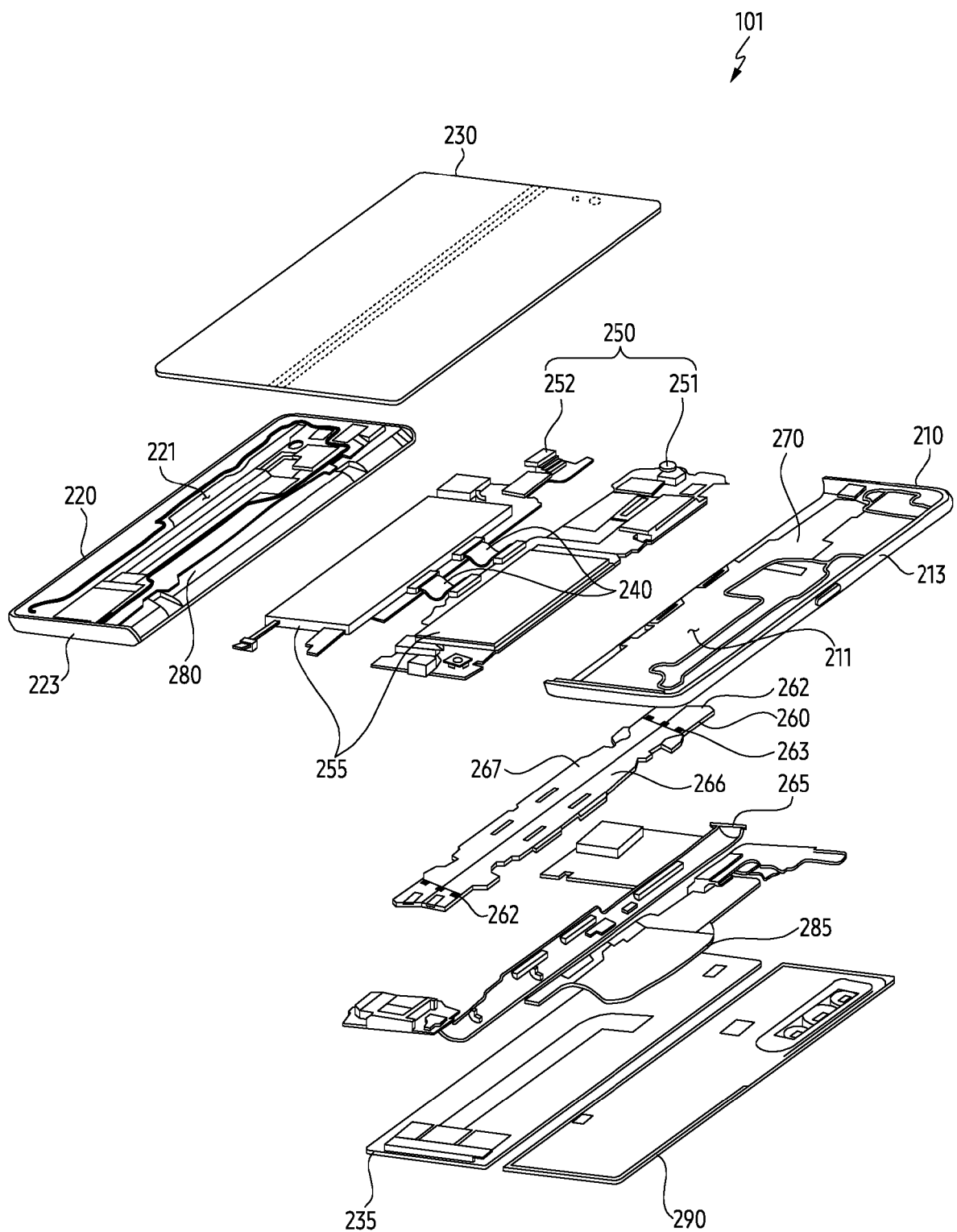
FIG. 2C is an exploded view of an electronic device according to an embodiment of the disclosure.

FIG. 2A illustrates an unfolded state of an electronic device according to an embodiment of the disclosure, FIG. 2B illustrates a folded state of an electronic device according to an embodiment of the disclosure, and FIG. 2C illustrates an exploded view of an electronic device according to an embodiment of the disclosure.

Referring to FIGS. 2A, 2B, and 2C, the electronic device 101 may include a first housing 210, a second housing 220, and a flexible display panel 230.

In one embodiment of the disclosure, the first housing 210 may include a first surface 211, a second surface 212 facing away the first surface 211, and a first side 213 surrounding at least a portion of the first surface 211 and the second surface 212. In an embodiment of the disclosure, the second surface 212 may further include at least one camera 234 exposed out through part of the second surface 212. In an embodiment of the disclosure, the first housing 210 may include a first protection member 214 disposed along an edge of the first surface 211. In an embodiment of the disclosure, the first housing 210 may provide a space formed by the first surface 211, the second surface 212, and the first side 213, for mounting therein various components of the electronic device 101. In an embodiment of the disclosure, the first side 213 and a second side 223 may include a conductive material, a non-conductive material, or a combination thereof. For example, the second side 223 may include a conductive member 228 and a non-conductive member 229. The conductive member 228 may include a plurality of conductive members, and the plurality of conductive members may be spaced apart from each other. The non-conductive member 229 may be disposed between the plurality of conductive members. An antenna structure may be formed by some of the plurality of conductive members and the plurality of non-conductive members or a combination thereof.

In an embodiment of the disclosure, the second housing 220 may include a third surface 221, a fourth surface 222 facing away the third surface 221, and a second side 223 surrounding at least part of the third surface 221. In an embodiment of the disclosure, the fourth surface 222 may further include a display panel 235 disposed thereon. A camera 226 may be disposed to face the fourth surface 222 from the inside of the second housing 220 so as to obtain an external image through the fourth surface 222. The camera 226 may be disposed underneath the display panel 235 to be covered by the display panel 235. In one embodiment of the disclosure, the camera 226 may be disposed underneath the display panel 235 and the display panel 235 may be aligned with a lens of the camera 226, so that it may include an aperture to transmit light from the outside to the camera 226. According to an embodiment of the disclosure, each of the first housing 210 and the second housing 220 may include a first protection member 214 and a second protection member 224, respectively. The first protection member 214 and the second protection member 224 may be disposed on the first surface 211 and the third surface 221 along a periphery of a flexible display panel 230. The first protection member 214 and the second protection member 224 may be formed to protect inflow of foreign substances (e.g., dust or moisture) through a gap between the flexible display panel 230 and the first housing 210 and the second housing 220. The first protection member 214 may be disposed along an edge of a first display area 231, and the second protection member 224 may be disposed along an edge of a second display area 232. The first protection member 214 may be formed attached to the first side 213 of the first housing 210, or may be formed integrally with the first side 213. The second protection member 224 may be formed attached to the second side 223 of the second housing 220, or may be formed integrally with the second side 223.

In an embodiment of the disclosure, the second side 223 may be pivotably or rotatably connected to the first side 213 through a hinge structure 260 mounted onto a hinge cover 265. The hinge structure 260 may include a hinge module 262, a first hinge plate 266, and a second hinge plate 267. The first hinge plate 266 may be connected to the first housing 210, and the second hinge plate 267 may be connected to the second housing 220. In an embodiment of the disclosure, the second housing 220 may provide a space defined by the third surface 221, the fourth surface 222 facing and spaced away from the third surface 221, and the side 223 surrounding at least part of the third surface 221 and the fourth surface 222, as a space for mounting various components of the electronic device 101. In an embodiment of the disclosure, the flexible display panel 230 may include a window exposed to the outside. The window may be formed to protect the surface of the flexible display panel 230 and include a transparent member, so as to transmit visual information provided from the flexible display panel 230 to the outside. The window may include a glass material, such as e.g., ultra-thin glass (UTG) or a polymer material, such as e.g., polyimide (PI). In an embodiment of the disclosure, the flexible display panel 230 may be disposed on the first surface 211 of the first housing 210 and the third surface 221 of the second housing 220 across the hinge cover 265. The flexible display panel 230 may include a first display area 231 disposed on the first surface 211 of the first housing, the second display area 232 disposed on the third surface 221 of the second housing, and a third display area 233 disposed between the first display area 231 and the second display area 232. The first display area 231, the second display area 232, and the third display area 233 may form a front surface of the flexible display panel 230.

According to an embodiment of the disclosure, an opening may be formed in a portion of the display area of the flexible display panel 230, or a recess or an opening may be formed in a supporting member (e.g., a bracket) supporting the flexible display panel 230. The electronic device 101 may include at least one of a sensor module 238 or a camera 236 aligned with the recess or the opening. For example, the first display area 231 may further include the camera 236 capable of acquiring an image from the outside through a part of the first display area 231 and the sensor module 238 generating an electrical signal or data value corresponding to an external environment state. According to an embodiment of the disclosure, one or more of the sensor module 238 or the camera 236 may be arranged on a back side of the flexible display panel 230 corresponding to the first display area 231 or the second display area 232 of the flexible display panel 230. For example, at least one of the camera 236 or the sensor module 238 may be disposed underneath the flexible display panel 230 to be covered by the flexible display panel 230. At least one of the camera 236 or the sensor module 238 may be covered by the flexible display panel 230 so as to be not exposed to the outside. However, the configuration is not limited thereto, and the flexible display panel 230 may include an opening for exposing the camera 236 and/or the sensor module 238 to the outside. Although not shown in FIGS. 2A and 2B, according to an embodiment of the disclosure, the flexible display panel 230 may further include a rear surface opposite to the front surface. In an embodiment of the disclosure, the flexible display panel 230 may be supported by a first supporting member 270 of the first housing 210 and a second supporting member 280 of the second housing 220.

In an embodiment of the disclosure, the hinge structure 260 may be configured to rotatably connect the first supporting member 270 forming the first housing 210 and fastened to the first hinge plate 266, and the second supporting member 280 forming the second housing 220 and fastened to the second hinge plate 267.

In an embodiment of the disclosure, the hinge cover 265 surrounding the hinge structure 260 may be at least partially exposed to the outside through between the first housing 210 and the second housing 220, while the electronic device 101 is in the folded state. In an embodiment of the disclosure, the hinge cover 265 may be covered by the first housing 210 and the second housing 220 while the electronic device 101 is in the unfolded state.

In an embodiment of the disclosure, the electronic device 101 may be configured to be folded with respect to a folding axis 237 passing through the hinge cover 265. For example, the hinge cover 265 may be disposed in between the first housing 210 and the second housing 220 of the electronic device 101 to allow the electronic device 101 to be bent, curved or folded. For example, the first housing 210 may be connected to the second housing 220 through the hinge structure 260 mounted on the hinge cover 265, and may rotate with respect to the folding axis 237. For example, the hinge structure 260 may include hinge modules 262 disposed at both ends of the first hinge plate 266 and the second hinge plate 267. The hinge module 262 may include hinge gears engaged with each other therein, so that the first hinge plate 266 and the second hinge plate 267 are caused to rotate about the folding axis. The first housing 210 coupled to the first hinge plate 266 may be connected to the second housing 220 coupled to the second hinge plate 267, and may be caused to rotate about the folding axis by the hinge modules 262.

In an embodiment of the disclosure, the electronic device 101 may be folded to face each other by rotating the first housing 210 and the second housing 220 with respect to the folding axis 237. In an embodiment of the disclosure, the electronic device 101 may be folded such that the first housing 210 and the second housing 220 can be laid over or overlap each other.

Referring to FIG. 2C, the electronic device 101 may include a first supporting member 270, a second supporting member 280, a hinge structure 260, a flexible display panel 230, and a printed circuit board 250, a battery 255, a hinge cover 265, an antenna 285, a display panel 235 and a rear plate 290. According to an embodiment of the disclosure, the electronic device 101 may omit at least one of those components or may further include one or more other components. At least one of the components of the electronic device 300 may be the same as or similar to at least one of the components of the electronic device 101 of FIG. 1, 2A, or 2B, and redundant descriptions thereof will be refrained from the following.

The hinge structure 260 may include a hinge module 262, a first hinge plate 266, and a second hinge plate 267. The hinge module 262 may include a hinge gear 263 that causes the first hinge plate 266 and the second hinge plate 267 to be pivotable. The hinge gears 263 may rotate with being engaged with each other to cause the first hinge plate 266 and the second hinge plate 267 to rotate. The hinge module 262 may include a plurality of hinge modules. Each of the plurality of hinge modules may be disposed at both ends formed by the first hinge plate 266 and the second hinge plate 267.

The first hinge plate 266 may be coupled to the first supporting member 270 of the first housing 210, and the second hinge plate 267 may be coupled to the second supporting member 280 of the second housing 220. The first housing 210 and the second housing 220 may rotate corresponding to the rotation of the first hinge plate 266 and the second hinge plate 267.

The first housing 210 may include the first supporting member 270 and the second supporting member 280. The first supporting member 270 may be partially surrounded by the first side 213, and the second supporting member 280 may be partially surrounded by the second side 223. The first supporting member 270 may be integrally formed with the first side 213, and the second supporting member 280 may be integrally formed with the second side 223. According to an embodiment of the disclosure, the first supporting member 270 may be formed separately from the first side 213, and the second supporting member 280 may be formed separately from the second side 223. The first side 213 and the second side 223 may be formed of a metal material, a non-metal material, or a combination thereof, and may be used as an antenna.

The first supporting member 270 may be coupled to the flexible display panel 230 on one surface, and coupled to the rear plate 290 on the other surface. Further, the second supporting member 280 may be coupled to the flexible display panel 230 on one surface and coupled to the display panel 235 on the other surface.

The printed circuit board 250 and the battery 255 may be disposed in between a surface formed by the first supporting member 270 and the second supporting member 280 and a surface formed by the display panel 235 and the rear plate 290. The printed circuit board 250 may be separated to be disposed on each of the first supporting member 270 of the first housing 210 and the second supporting member 280 of the second housing 220. The shapes of the first printed circuit board 251 disposed on the first supporting member 270 and the second printed circuit board 252 disposed on the second supporting member 280 may be different from each other depending on the space inside the electronic device. Components for implementing various functions of the electronic device 10 may be mounted onto the first printed circuit board 251 and the second printed circuit board 252. According to an embodiment of the disclosure, on the first printed circuit board 251 may be mounted various components for implementing the overall function of the electronic device 101, and on the second printed circuit board 252 may be disposed various electronic components for implementing some functions of the first printed circuit board 251 or components for driving the display panel 235 disposed on the fourth surface 222. The first printed circuit board 251 and the second printed circuit board 252 may be electrically connected to each other by a flexible printed circuit board 240.

The battery 255 may be, for example, a device to supply electric power to one or more of the components of the electronic device 101, and may include, for example, a non-rechargeable primary battery, or a rechargeable secondary battery, or a fuel cell. At least some of the battery 255 may be disposed on substantially the same plane as the printed circuit board 250.

The surfaces of the printed circuit board 250 and the battery 255, which are formed with substantially the same surface, may be disposed on one surface of the first supporting member 270 and the second supporting member 280 (e.g., a side facing the second surface 212 and the fourth surface 222, or a side facing the display panel 235 and the rear plate 290). For example, the flexible display panel 230 may be disposed on the first surface 211 and the third surface 221, and the printed circuit board 250 and the battery 255 may be disposed on the second surface 212 and the fourth surface 222 facing the side on which the flexible display panel 230 is disposed.

In one embodiment of the disclosure, the antenna 285 may be disposed between the rear plate 290 and the battery 255 in one embodiment. The antenna 285 may include, for example, a near field communication (NFC) antenna, a wireless charging antenna, and/or a magnetic secure transmission (MST) antenna. The antenna 285 may, for example, perform short-range communication with an external device or wirelessly transmit/receive power required for charging.

Figure 3A:
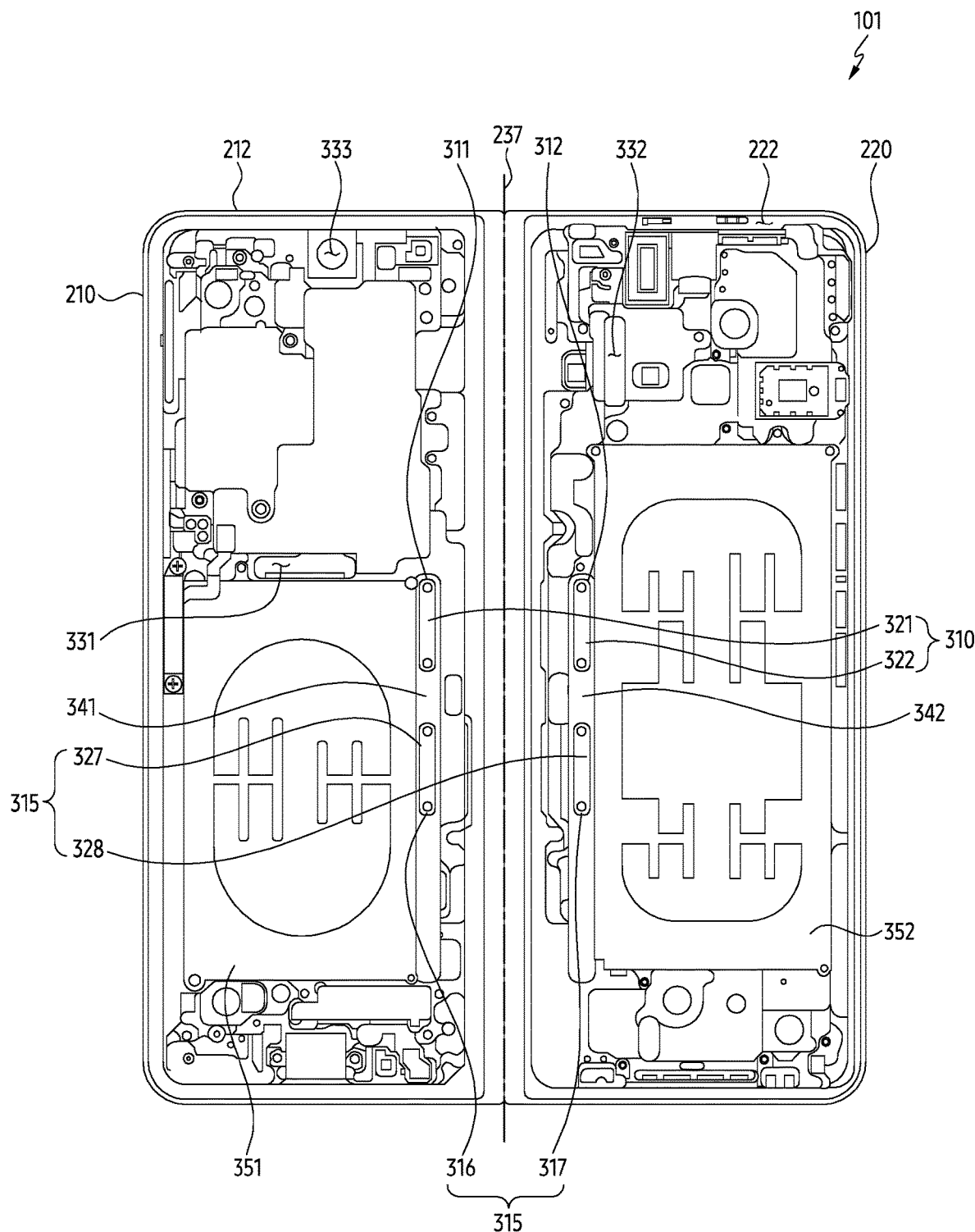
FIG. 3A is a front view illustrating a front surface of a side supporting member of an electronic device according to an embodiment of the disclosure.
Figure 3B:
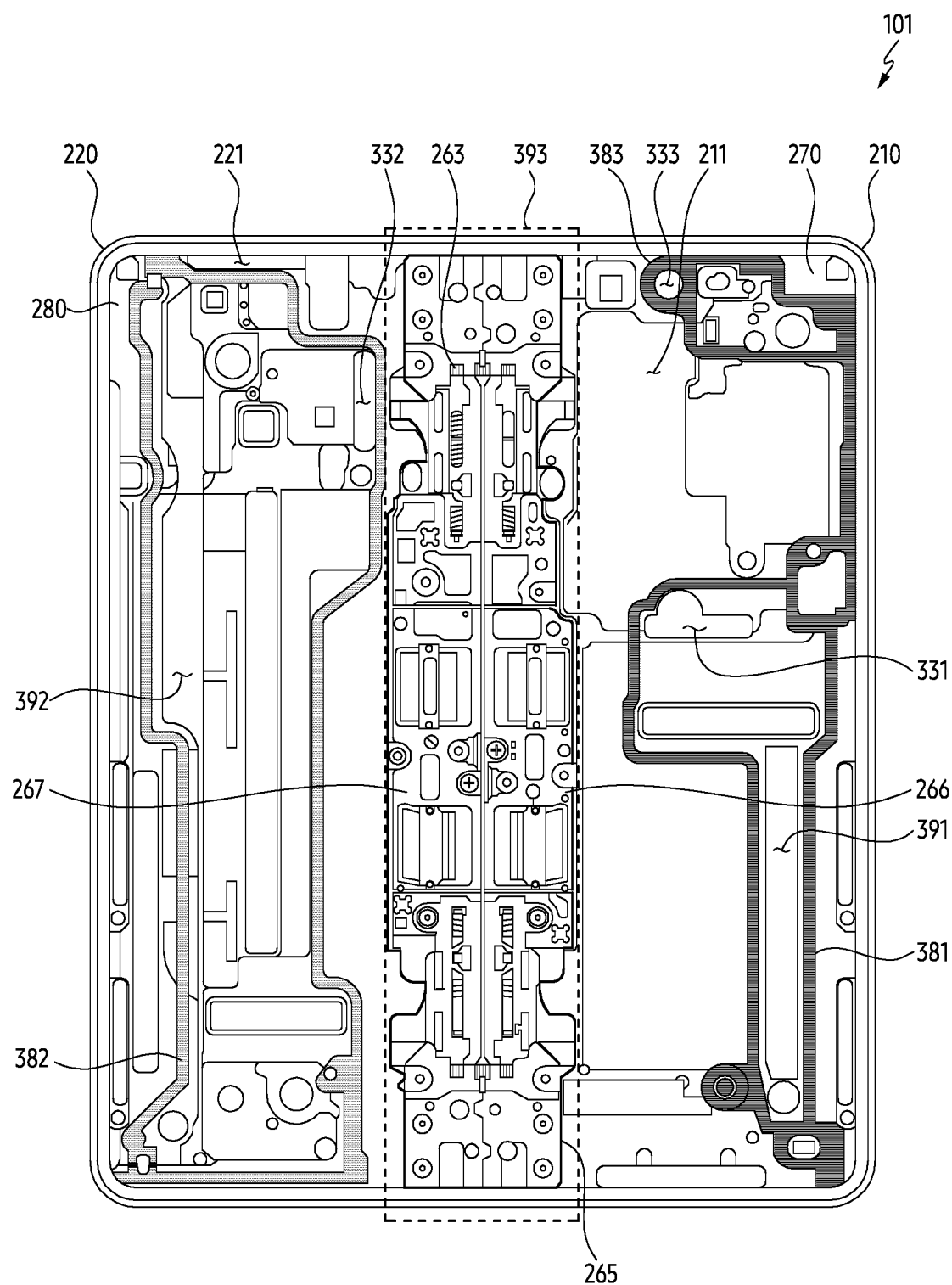
FIG. 3B is a rear view illustrating a rear surface of a side supporting member of an electronic device according to an embodiment of the disclosure.

FIG. 3A is a front view illustrating a front of a side supporting member of an electronic device according to an embodiment of the disclosure. FIG. 3B is a rear view illustrating a rear surface of a side supporting member of an electronic device according to an embodiment of the disclosure. Further, FIG. 3C is an exploded view illustrating an arrangement of a sealing member included in an electronic device according to an embodiment of the disclosure.

Figure 3C:
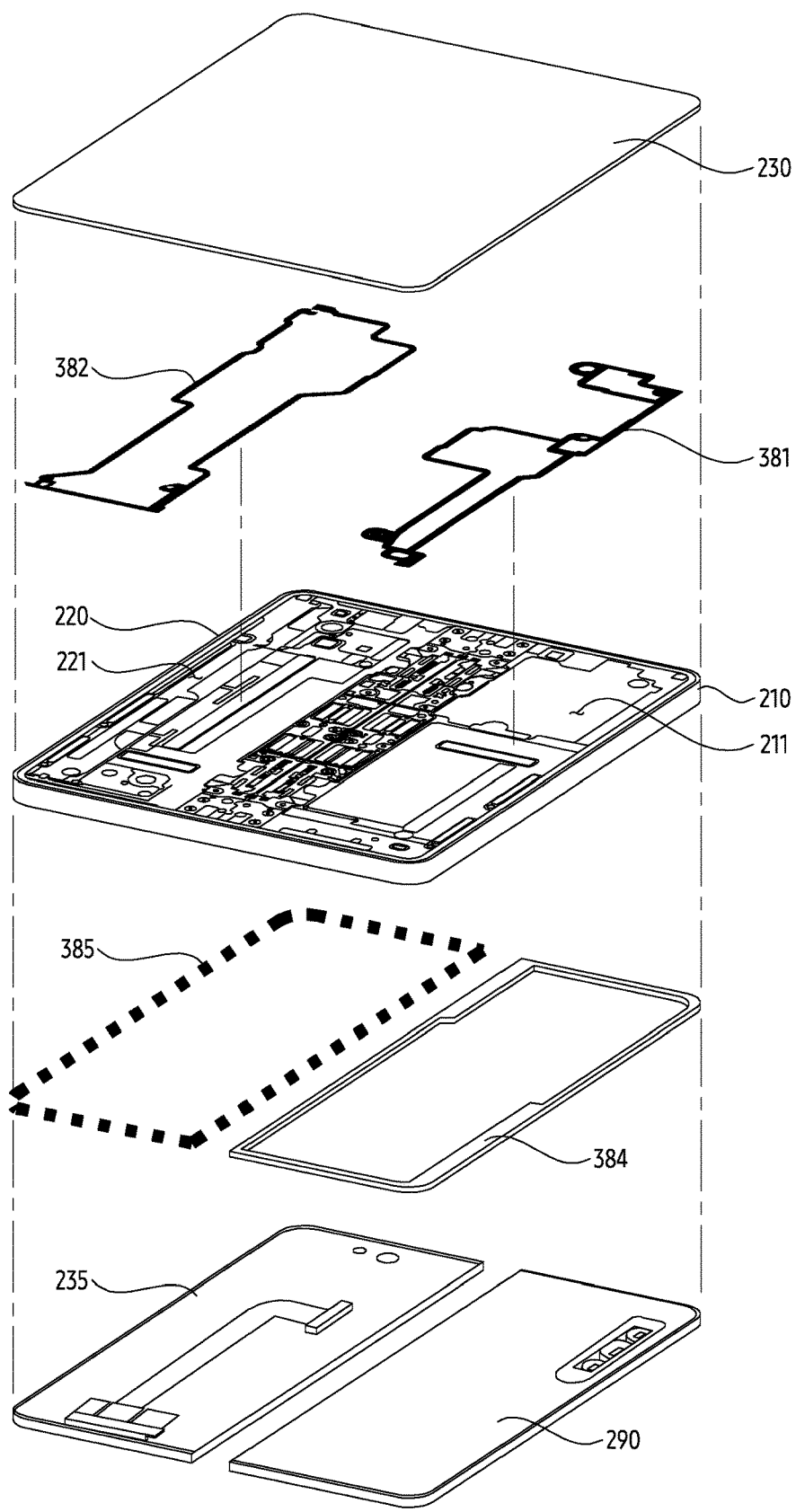
FIG. 3C is an exploded view illustrating an arrangement of a sealing member included in an electronic device according to an embodiment of the disclosure.

Referring to FIGS. 3A, 3B, and 3C, the first supporting member 270 and the second supporting member 280 may be configured to support the flexible display panel (e.g., a flexible display panel 230 of FIG. 2A). The flexible display panel may include a front surface to emit light to provide information and a rear surface facing the front surface. The first surface 211 of the first housing 210 and the third surface 221 of the second housing 220 may be bonded to the rear surface of the flexible display panel. In a folded state of the first surface 211 of the first housing 210 and the third surface 221 of the second housing 220, the flexible display panel may be in a folded state in which the surfaces of a first display area 231 of the flexible display panel and a second display area 232 are placed to face each other. In an unfolded state in which the first surface 211 of the first housing 210 and the third surface 221 of the second housing 220 are placed to face the same direction, the flexible display panel 230 may be in an unfolded state in which the first display area 231 and the second display area 232 of the flexible display panel 230 are placed to face the same direction.

In an embodiment of the disclosure, the electronic device 101 may be configured to provide an unfolded state in which the first housing 210 and the second housing 220 are fully unfolded out by means of the hinge structure 260. The first supporting member 270 may be connected to the second supporting member 280 through the hinge structure 260 to convert the electronic device 101 into either a folded state or an unfolded state. As the hinge gear 263 rotates, the first supporting member 270 and the second supporting member 280 attached to the hinge plates 266 and 267 of the hinge structure 260 may be caused to move. The hinge plates 266 and 267 may include a first hinge plate 266 coupled to the first supporting member 270 and a second hinge plate 267 coupled to the second supporting member 280. The electronic device 101 may be converted into either the folded state or the unfolded state by rotation of the hinge gear 263.

At least a portion of the first printed circuit board (e.g., a first printed circuit board 251 of FIG. 3C) and the second printed circuit board (e.g., a second printed circuit board 252 of FIG. 3C) may be disposed on the first hinge plate 266 and the second hinge plate 267 in an overlapping manner.

The first supporting member 270 and the second supporting member 280 may be configured to support various components, such as a printed circuit board, a battery, and/or a display panel arranged within the electronic device 101. The first supporting member 270 may be integrally formed extending from a side of the first housing 210 (e.g., a first side 213 of FIG. 2A) or may be formed separately, so as to be positioned within the first housing 210. The first supporting member 270 may include a flat surface extending from the side into the electronic device 101. The first supporting member 270 may include a first surface 211 facing the flexible display panel 230 and a second surface 212 facing the rear cover. The second supporting member 280 may be integrally formed extending from a side of the second housing 220 (e.g., a third side 223 of FIG. 2A), or may be formed separately from the side of the second housing 220, so as to be positioned within the second housing 220. The second supporting member 280 may include a flat surface extending from the side into the electronic device 101.

The first supporting member 270 may include a first waterproof tape 381 applied to the first surface 211. The second supporting member 280 may include a second waterproof tape 382 applied to the second surface 212. The first waterproof tape 381 and the second waterproof tape 382 may be configured to protect moisture introduced through a gap between the hinge structure 260 and the hinge cover 265, and the first housing 210 and the second housing 220 from being carried into the electronic components mounted within the electronic device 101. Each of the first waterproof tape 381 and the second waterproof tape 382 may be disposed on the first surface 211 and the second surface 212 in a closed curve.

The first waterproof tape 381 may form a first waterproof area 391 blocking an inflow of moisture. For example, the first waterproof tape 381 may be configured to pass through the first supporting member 270 and wrap an area in which an opening 331 connecting the first surface 211 and the third surface 221 is located, thereby protecting moisture flowing in through the gap between the hinge cover 265 and the hinge structure 260 and the gap between the hinge structure 260 and the hinge cover 265 to reach the first surface 211 from being transferred to components, such as a printed circuit board and/or a processor disposed on the third surface 221.

The second waterproof tape 382 may form a second waterproof area 392 in which the inflow of moisture is blocked by the second waterproof tape 382. For example, the second waterproof tape 382 may be configured to pass through the second supporting member 280 and wrap the area in which an opening 332 connecting the second surface 212 and the fourth surface 222 is located, thereby preventing moisture present in the second surface 212 from being transferred to the components, such as a printed circuit board and/or a battery disposed on the fourth surface 222.

According to an embodiment of the disclosure, the first supporting member 270 may further include a third waterproof tape 383 applied on the first surface 211. The third waterproof tape 383 may wrap around an opening 333 that transmits light to a camera (not shown) disposed under the flexible display panel 230. The opening 333 for transmitting light to the camera may be configured to pass through the first surface 211 facing the flexible display panel 230 and the second surface 212 facing the first surface 211. Moisture permeated from the outside and held on the first surface 211 may be introduced into components located on the second surface 212 through a gap between the opening 333 and the camera. Accordingly, the third waterproof tape 383 makes it possible to prevent external moisture permeated through the gap between the hinge structure 260 and the first housing 210 and the second housing 220 from flowing into the electronic device along the gap between the camera and the opening 333. In addition to the first waterproof tape 381, the second waterproof tape 382 and the third waterproof tape 383, the waterproof tape may further include a sealing member, such as a waterproof tape, rubber, or waterproof resin (e.g., cured in placed gasket (CIPG)) for blocking inflow of moisture through an opening formed on supporting surfaces of the first supporting member 270 and the second supporting member 280. For example, the second supporting member 280 may further include a waterproof tape forming a closed curve along an edge of the fourth surface 222, on the fourth surface 222 facing the display panel 235.

The hinge structure 260 may be configured to be spaced apart from the first housing 210 and the second housing 220 for rotation of the first housing 210 and the second housing 220. Moisture introduced through the gap between the hinge cover 265 and the hinge structure 260 may be one of inflow paths of moisture flowing into the interior of the electronic device 101 through the gap between the first housing 210 and the second housing 220. The area including the hinge structure 260 may be a part of a non-waterproof area 393 that cannot block moisture flowing into the first housing 210 and the second housing 220. For example, the non-waterproof area 393 may be a remaining area other than the area where moisture is blocked, such as the first waterproof area 391 and the second waterproof area 392.

According to an embodiment of the disclosure, a first connection passage 310 for connection of one flexible printed circuit board (not shown) and a second connection passage 315 for connection of another flexible printed circuit board (not shown) distinct from the flexible printed circuit board may be formed on the first supporting member 270 and the second supporting member 280 in an area where the hinge structure 260 is seated. The connection passage 310 may be formed of a plurality of openings 321, 322, 327 and 328 penetrating the first supporting member 270 and the second supporting member 280. According to an embodiment of the disclosure, when the thickness of the openings 321, 322, 327 and 328 is insufficient, the first supporting member 270 may include a sidewall surrounding an edge 311 of the first opening 321 formed in the first supporting member 270, through which one end of the one flexible printed circuit board can pass. The second supporting member 280 may include a sidewall surrounding an edge 312 of the second opening 322 formed in the second supporting member 280, through which the other end of the one flexible printed circuit board can pass. The first supporting member 270 may include a third opening 327 of the second connection passage 315, through which one end of the other flexible printed circuit board distinct from the one flexible printed circuit board can pass. The second supporting member 280 may include a fourth opening 328 of the second connection passage 315, through which the other end of the other flexible printed circuit board can pass.

The first connection passage 310 may include the first opening 321 and the second opening 322 formed in the first supporting member 270 and the second supporting member so that the one flexible printed circuit board can pass through the first housing 210 and the second housing 220. The second connection passage 315 may include the third opening 327 and the fourth opening 328 formed in the first supporting member 270 and the second supporting member 280 so that the other flexible printed circuit board can pass through the first housing 210 and the second housing 220. According to an embodiment of the disclosure, the first supporting member 270 may include a first sidewall 341 disposed between a first battery supporting part 351 and an area in which the first printed circuit board is disposed. The first battery supporting part 351 may be formed as a groove in order to prevent movement of the battery seated thereon. The first sidewall 341 may be formed along a part of an edge of the first battery supporting part 351. For example, the first sidewall 341 may be formed along an edge closer to a folding axis 237 among edges of the first battery supporting part 351. The first opening 321 and the third opening 327 may pass through the first sidewall 341. According to an embodiment of the disclosure, when the thickness of the first sidewall 341 is sufficient to insert a material, such as rubber into the first opening 321 and the third opening 327, the first supporting member 270 may not include a rib structure extending toward the second surface 212 along edges of the first opening 321 and the third opening 327. According to an embodiment of the disclosure, when a connection passage is formed in an area where the thickness of the first sidewall 341 is thin or there is no structure, such as the first sidewall 341, the first supporting member 270 may include a rib structure formed along the edges of the first opening 321 and the third opening 327 and extending in a direction perpendicular to the edges.

According to an embodiment of the disclosure, the second supporting member 280 may include a second sidewall 342 disposed between the second battery supporting part 352 and an area in which the printed circuit board is disposed. The second battery supporting part 352 may include a groove in order to prevent movement of the battery seated thereon. The second sidewall 342 may be formed along a part of an edge of the second battery supporting part 352. For example, the second sidewall 342 may be formed along an edge closer to the folding axis 237 among edges of the second battery supporting part 352. The second opening 322 and the fourth opening 328 may pass through the second sidewall 342.

For another example, the first sidewall 341 may include a first rib extending from the edge 311 of the first opening 321 formed on the first supporting member 270, and the second sidewall 342 may include a second rib extending from the edge 312 of the second opening 322 formed on the second supporting member 280. The flexible printed circuit board may extend from the first housing 210 along the first connection passage 310 including the first opening 321 and the second opening 322 to the second housing 220. Further, the first sidewall 341 may include a third rib extending from an edge 316 of the third opening 327 formed on the first supporting member 270, and the second sidewall 342 may include a fourth rib extending from an edge 317 of the fourth opening 328 formed on the second supporting member 280. The other flexible printed circuit board may extend from the first housing 210 along the second connection passage 315 including the third opening 327 and the fourth opening 328 to the second housing 220.

The first supporting member 270 may include a first battery supporting part 351 for supporting a battery disposed on the second surface 212. The first battery supporting part 351 may be disposed on a substantially flat surface formed on one surface of the first supporting member 270. The first supporting member 270 may include a first sidewall 341 formed along at least part of an edge of the first battery supporting part 351. For example, the first sidewall 341 may be disposed between the first battery supporting part 351 and the folding axis 237 and may come in contact with the first battery supporting part 351. The first battery supporting part 351 and the first sidewall 341 may have a height capable of fixing a position of a first battery.

The second supporting member 280 may include a second battery supporting part 352 for supporting the battery disposed on the fourth surface 222. The second battery supporting part 352 may be disposed on a substantially flat surface formed on one surface of the second supporting member 280. The second supporting member 280 may include a second sidewall 342 formed along at least part of an edge of the second battery supporting part 352. For example, the second sidewall 342 may be disposed between the second battery supporting part 352 and the folding axis 237 and may come in contact with the second battery supporting part 352. The second battery supporting part 351 and the second sidewall 342 may have a height capable of fixing a position of a second battery.

Referring again to FIGS. 3A and 3C, the electronic device may include a fourth waterproof tape 384 and an adhesive member 385. The fourth waterproof tape 384 may include an adhesive component for bonding the second surface 212 and the rear plate 290 of the first housing 210.

According to an embodiment of the disclosure, the fourth waterproof tape 384 may be disposed between the second surface 212 and the rear plate 290 of the first housing 210. The fourth waterproof tape 384 may be disposed along an edge of the second surface 212 of the first housing 210. The fourth waterproof tape 384 may be formed with a closed curved surface. The inside of the closed curved surface of the fourth waterproof tape 384 may be of a waterproof area into which penetrating of moisture is prevented. Thus, the fourth waterproof tape 384 makes it possible to prevent moisture introduced in between the second surface 212 and the rear plate 290 of the first housing 210 from flowing into the electronic device.

According to an embodiment of the disclosure, an adhesive member 385 may be included between the fourth surface 222 of the second housing 220 and the display panel 235. The adhesive member 385 may adhere the fourth surface of the second housing 220 to the display panel 235. The adhesive member 385 may be disposed along an edge of the second housing 220 or an edge of the display panel 235. The adhesive member 385 may include at least one of various adhesive materials, such as a double-sided tape (e.g., a thermoplastic resin or a thermosetting resin). The adhesive member 385 may fill a space in between the second housing 220 and the display panel 235 to prevent moisture flowing in from the outside from flowing into the electronic device 101.

According to an embodiment of the disclosure, each of the first waterproof tape 381, the second waterproof tape 382, the third waterproof tape 383, and the fourth waterproof tape 384 may include a plurality of waterproof tapes. For example, at each edge or connecting part of the first waterproof tape 381 may be incorporated different waterproof tapes. According to another embodiment of the disclosure, the first waterproof tape 381 may include different waterproof tapes applied on both sides with respect to a step difference formed in the first supporting member 270 of the first housing 210.

Figure 4:
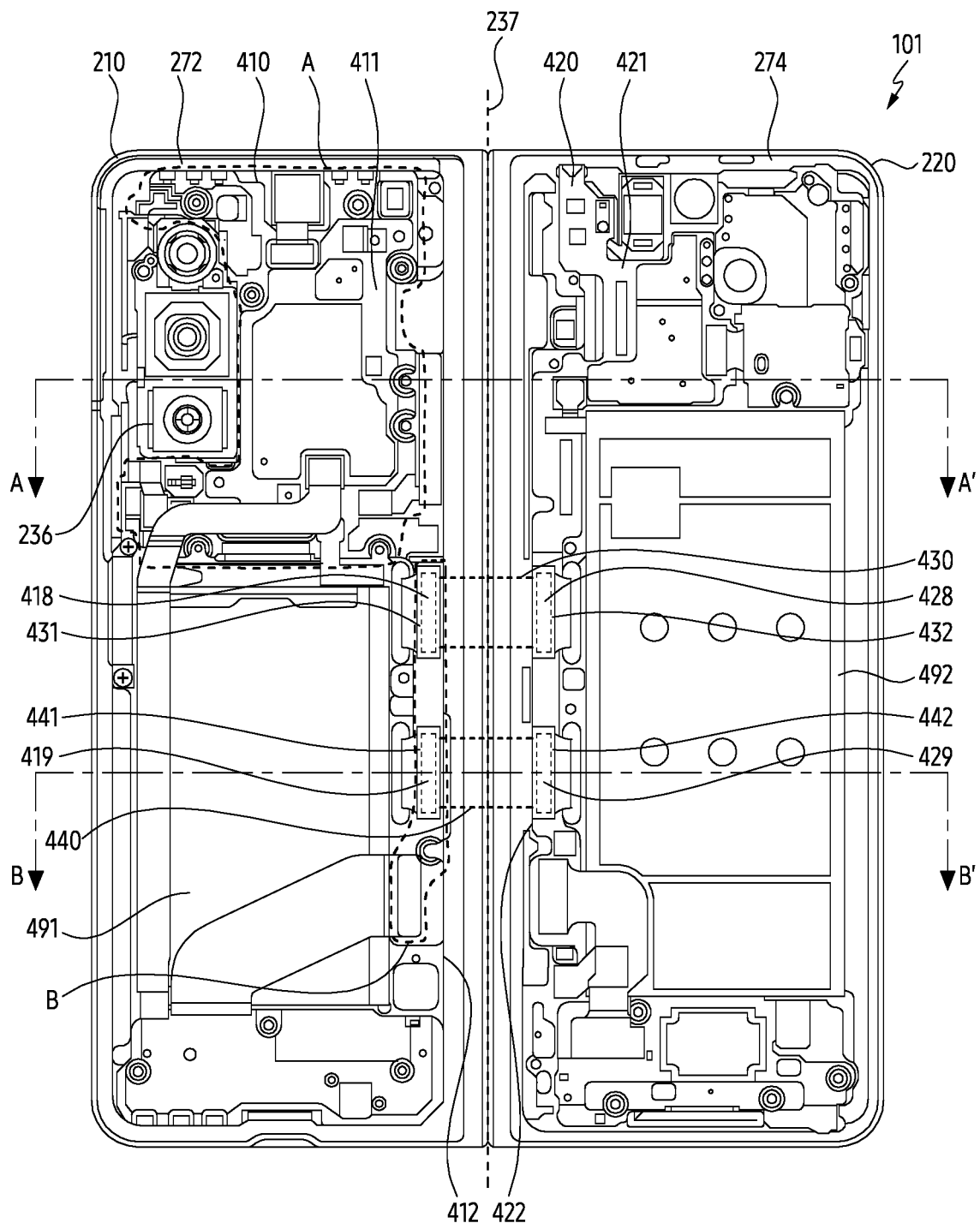
FIG. 4 illustrates an arrangement of electronic components mounted on a rear surface of a side supporting member of an electronic device according to an embodiment of the disclosure.

FIG. 4 illustrates an arrangement of components mounted on a rear surface of a side supporting member of an electronic device according to an embodiment of the disclosure.

Figure 5:
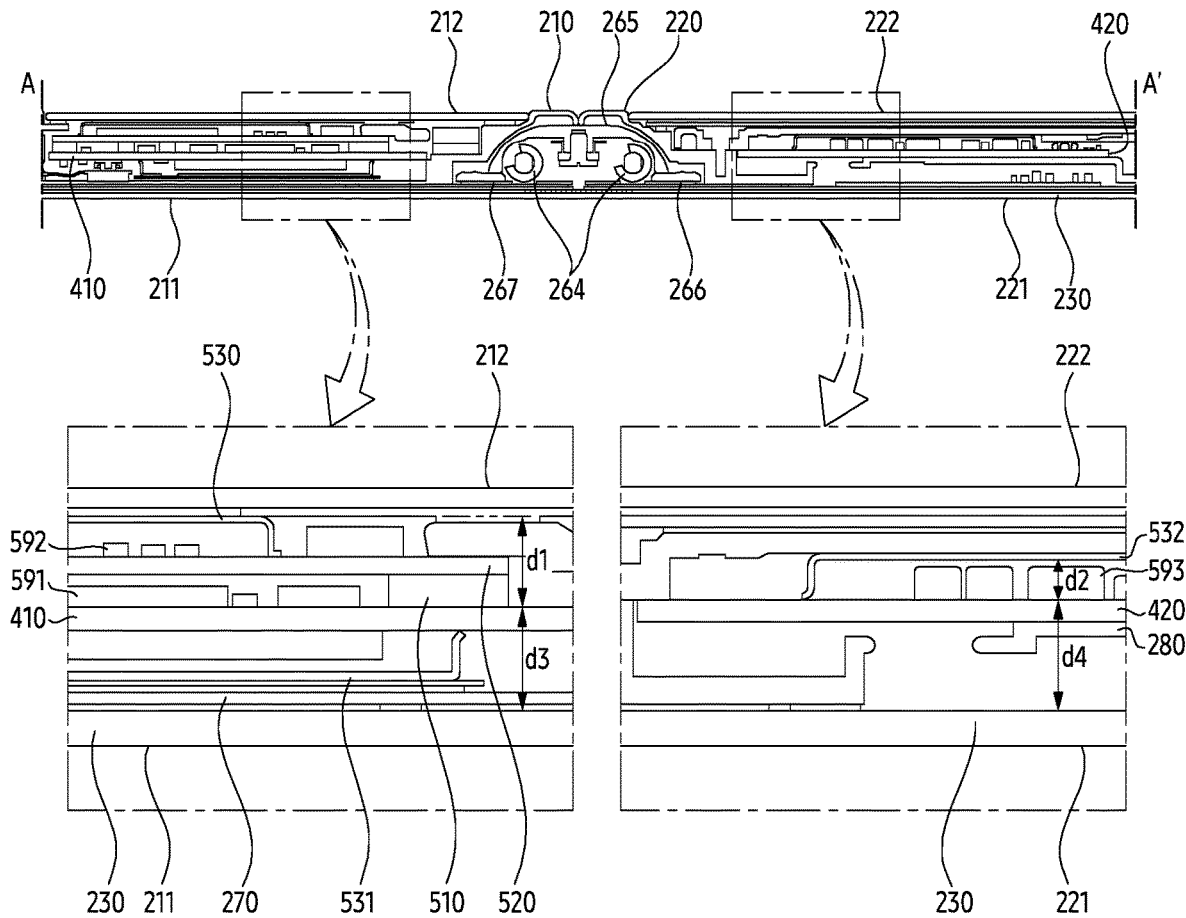
FIG. 5 is a cross-sectional view taken along a line A-A' of FIG. 4 of an electronic device according to an embodiment of the disclosure.

FIG. 5 is a cross-sectional view taken along a line A-A' of FIG. 4 of an electronic device according to an embodiment of the disclosure.

Figure 6:
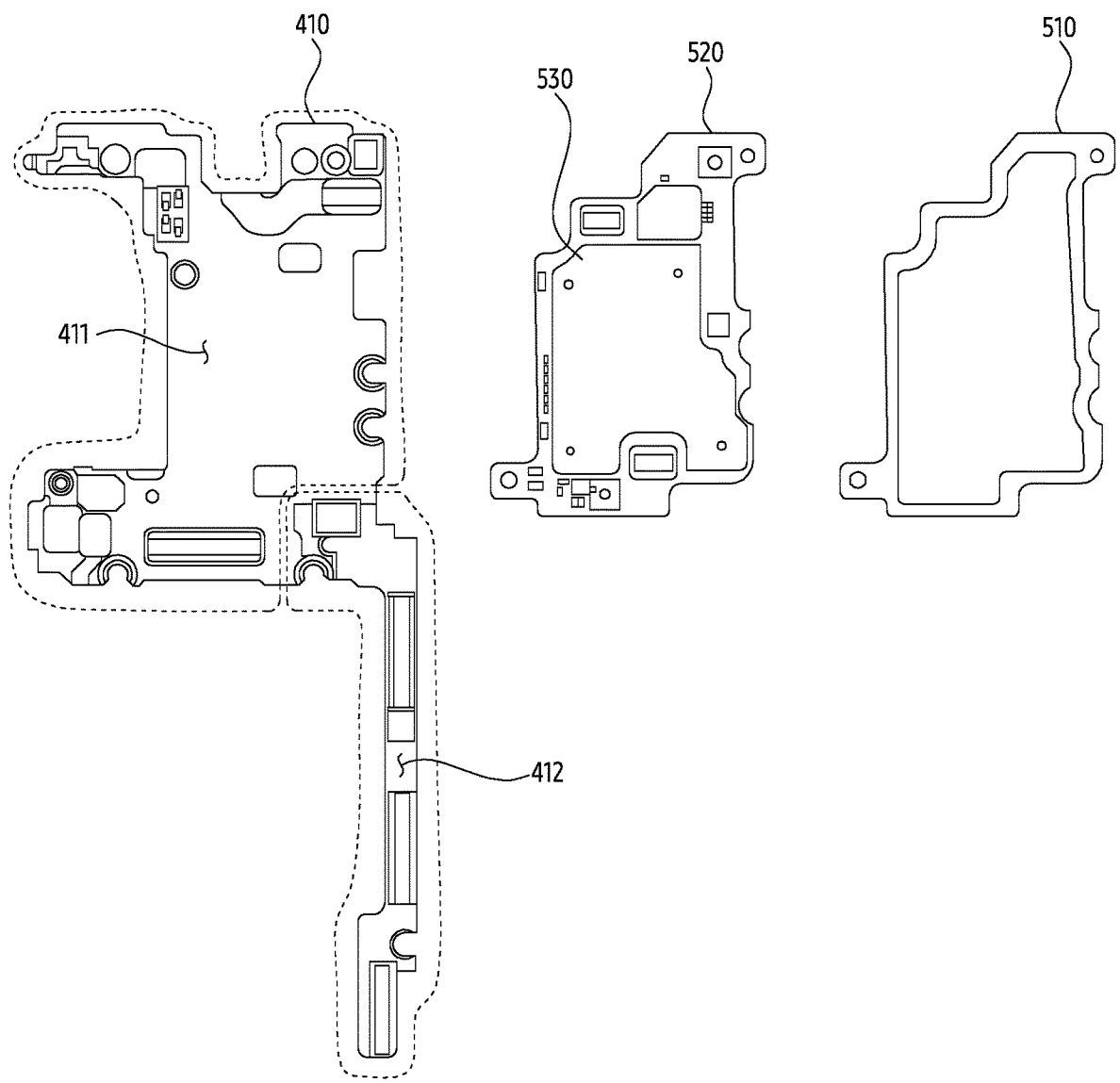
FIG. 6 is an exploded view of an interposer within an electronic device and a plurality of printed circuit boards coupled by the interposer according to an embodiment of the disclosure.

FIG. 6 is an exploded view of an interposer within an electronic device and a plurality of printed circuit boards coupled by the interposer, according to an embodiment of the disclosure.

Figure 7:
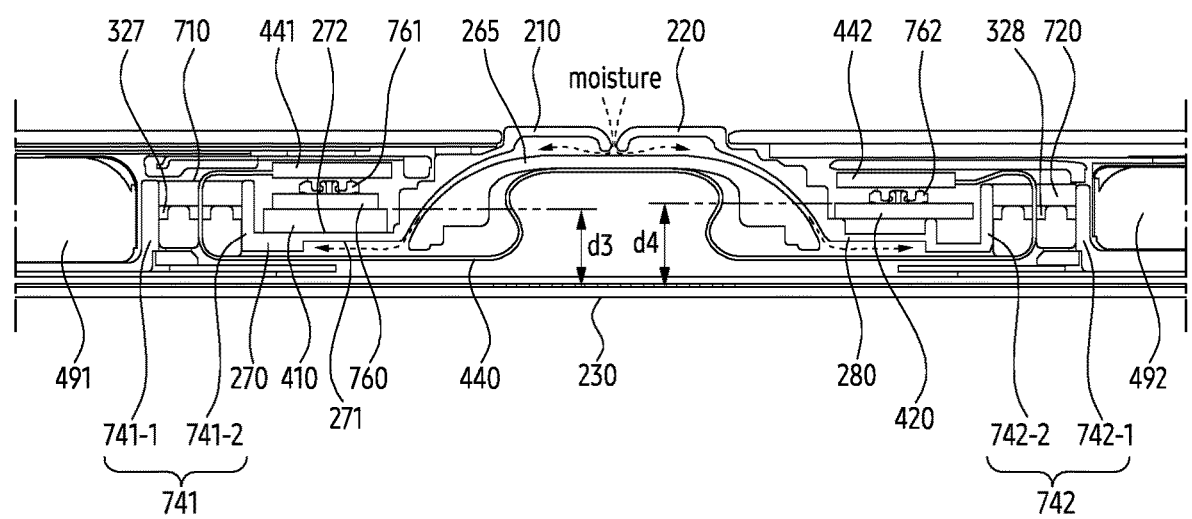
FIG. 7 is a cross-sectional view taken along a line B-B' of FIG. 4 of an electronic device according to an embodiment of the disclosure.

FIG. 7 is a cross-sectional view taken along a line B-B' of FIG. 4 of an electronic device according to an embodiment of the disclosure.

Figure 8:
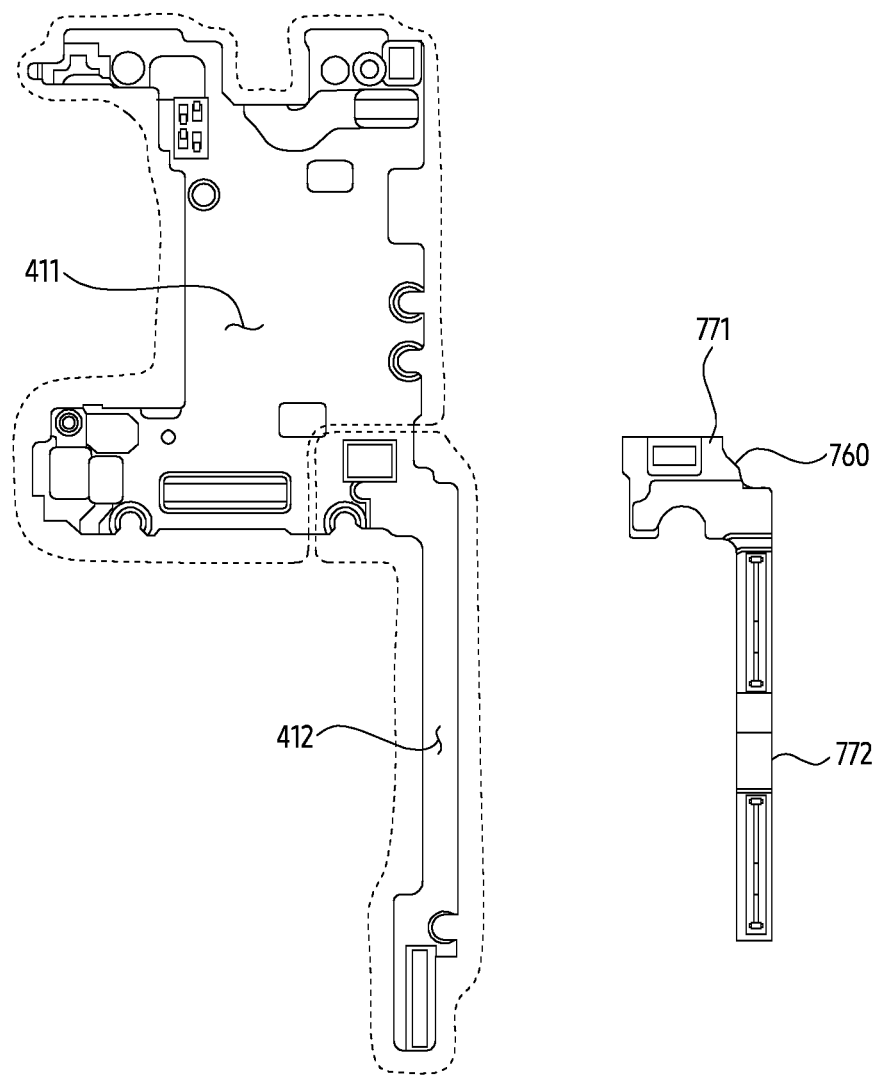
FIG. 8 is an exploded view of a plurality of printed circuit boards stacked in an electronic device according to an embodiment of the disclosure.

FIG. 8 is an exploded view of a plurality of printed circuit boards stacked within an electronic device according to an embodiment of the disclosure.

Referring now to FIGS. 4, 5, 6, and 8, the electronic device 101 may include a flexible display panel 230, a hinge structure 260, hinge plates 266 and 267, and housings 210, 220 and 265. The hinge structure 260 may include a hinge gear 263, a power transmission member 264, and hinge plates 266 and 267. When the hinge gear 263 rotates, the power transmission member 264 may rotate in response to rotation of the hinge. The power transmission member 264 may cause the hinge plates 266 and 267 to rotate based on the received rotational force. The first hinge plate 266 and the second hinge plate 267 may be coupled to the flexible display panel 230 or the first supporting member 270 and the second supporting member 280 to switch the flexible display panel 230 to an unfolding state (i.e., an unfolded state) or a folding state (i.e., a folded state). The first supporting member 270 of the electronic device 101 may be configured to support a first printed circuit board 410 and a first battery 491. According to an embodiment of the disclosure, the first printed circuit board 410 may be fixed onto the first supporting member 270. For example, the first printed circuit board 410 may be bonded to the second surface 212 using an adhesive member, or fixed to the second surface 212 using a fastening member, such as screw coupling, hook coupling or the like.

The first printed circuit board 410 may be attached to some of the components of the electronic device 101, and may be connected to some of the remaining components via a cable. The first printed circuit board 410 may include a body part 411 spaced apart from an upper edge of the first battery 491 and a neck part 412 spaced apart from another edge connected and extending to the upper edge of the first battery 491. For example, the body part 411 may be a part of the first printed circuit board 410 positioned between the edge closer to the first printed circuit board 410 and the first battery 491 among edges perpendicular to the first battery 491 and the folding axis 237. The neck part 412 may be a part of the first printed circuit board 410 positioned between the first battery 491 and the folding axis. At least parts of the first printed circuit board (e.g., a first printed circuit board 410 of FIG. 3C) and the fourth printed circuit board 420 may be disposed to overlap each other on the first hinge plate 266 and the second hinge plate 267. For example, when viewed from the rear plate (e.g., a rear plate 290 of FIG. 2C), at least part of the neck part 412 of the first printed circuit board 410 may be overlapped with the first hinge plate 266.

The neck part 412 may have a narrower width than that of the body part 411 and extend along the folding axis 237. The first printed circuit board 410 may include the body part 411 and the neck part 412 having different widths to secure a mounting space for the first battery 491. The capacity of the first battery 491 may be determined depending on the shapes of the body 411 and the neck 412. For example, the length of the first battery 491 may be determined depending on a distance from an edge of the body part 411 adjacent to the first battery 491 to another edge of the body part 411 adjacent to the upper edge of the first supporting member 270. The width of the first battery 491 may be determined depending on the width of the neck part 412. The capacity of the first battery 491 may be determined depending on the size of the first battery 491, and the size of the first battery 491 may be associated with the shapes of the body part 411 and the neck part 412.

The first printed circuit board 410 may be coupled with a second printed circuit board 760 and a third printed circuit board 520, according to the wiring structure and the shape or arrangement of components to be attached.

Referring to FIGS. 5 and 6, the first printed circuit board 410 may include a third printed circuit board 520 on an upper surface of the first printed circuit board 410 (e.g., a surface facing the second surface 212 of the first housing 210), and may be supported by the second supporting member 280. The third printed circuit board 520 may be coupled to the first printed circuit board 410 by an interposer 510. The interposer 510 may be disposed between the first printed circuit board 410 and the third printed circuit board 520. The interposer 510 may be configured to have a sidewall, and an electronic component 591 mounted on the first printed circuit board 410 may be disposed within the interposer 510 surrounded by the sidewall. The inner space of the interposer 510 may be surrounded by the sidewall of the interposer 510, the first printed circuit board 410, and the third printed circuit board 520. The interposer 510 may include a conductive material therein, and may further include a plurality of conductive members penetrating an upper surface facing the third printed circuit board 520 and a lower surface facing the first printed circuit board 410. The plurality of conductive members may be configured to electrically connect the first printed circuit board 410 and the third printed circuit board 520.

An upper shield can 530 may be disposed on an upper surface of the third printed circuit board 520. This upper shield can 530 makes it possible for electronic components 592 (such as electronic parts, an integrated circuit, or the like) attached to the upper surface of the third printed circuit board 520 to experience less effect from signals and electromagnetic waves emitted from various neighboring components.

The inner space of the first housing 210 may include the upper shield can 530, the first printed circuit board 410, the interposer 510, the third printed circuit board 520, and a lower shield can 531.

The upper shield can 530 may be disposed in a direction from the fourth surface 222 of the second housing 220 toward the third surface 221. The upper shield can 530 may be spaced apart from the fourth surface 222 of the second housing 220. One surface of the third printed circuit board 520 may be in contact with a surface of the upper shield can 530 facing the third surface 221. The third printed circuit board 520 may be physically coupled to the first printed circuit board 410 through the interposer 510. The distance between the fourth surface 222 and the first printed circuit board 410 may be associated with a sum of the thicknesses of the upper shield can 530, the interposer 510, and the third printed circuit board 520. As the number of wirings or components attached to the first printed circuit board 410 increases, the number of shield cans, interposers, and additional printed circuit boards may increase, and the distance between the first printed circuit board 410 and the second surface 212 may increase. In order to reduce the overall thickness of the electronic device 101, the first printed circuit board 410 may be disposed more adjacent to the third surface 221 on which the flexible display panel 230 is disposed. When it is difficult to place any component on its upper surface facing the second surface 212, the first printed circuit board 410 may be configured to place the component on its lower surface (e.g., a surface facing the first surface 211) facing the upper surface, and a lower shield can 531 may be further disposed as required.

Referring back to FIG. 4, according to an embodiment of the disclosure, the second supporting member 280 may include a second battery 492 and a fourth printed circuit board 420. The fourth printed circuit board 420 may include a body part 421 and a neck part 422, and may be supported by the second supporting member 280. The body part 421 may be spaced apart from an upper edge of the second battery 492. The neck part 422 may be spaced apart from the other edge that extends connected to the upper edge of the second battery 492.

The capacity of the second battery 492 may be determined depending on the shape of the body part 421 and the neck part 422 of the fourth printed circuit board 420. For example, the length of the second battery 492 may be determined based on the distance from one edge of the body part 421 adjacent to the second battery 492 to the other edge of the body part 421 adjacent to the upper edge of the second supporting member 280. The width of the second battery 492 may be determined based on the width of the neck part 422. The capacity of the second battery 492 may be associated with the shapes of the body part 421 and the neck part 422.

According to one embodiment of the disclosure, the length of the body part 411 of the first printed circuit board 410 is longer than the length of the body part 421 of the fourth printed circuit board 420, and therefore, the length of the first battery 491 may be shorter than the length of the second battery 492. Depending on the sizes of the first battery 491 and the second battery 492, the capacity of the first battery 491 may be smaller than that of the second battery 492.

The fourth printed circuit board 420 may include a shield can 532 on a surface facing the fourth surface 222. The shield can 532 may be configured to shield external noise that may be transmitted to components arranged within the internal space. The fourth printed circuit board 420 may have fewer electronic elements or components than the first printed circuit board 410 thereon, and therefore, the distance from the flexible display panel 230 to the fourth printed circuit board 420 may be longer than the distance to the first printed circuit board 410. The fourth printed circuit board 420 may be farther from the flexible display panel 230 than the first printed circuit board 410, and may be closer to the fourth surface 222 on which the display panel 235 is disposed.

According to an embodiment of the disclosure, the neck part 412 of the first printed circuit board 410 and the neck part 422 of the fourth printed circuit board 420 may be disposed with the folding axis 237 interposed therebetween.

The first printed circuit board 410 and the fourth printed circuit board 420 may be connected through the first flexible printed circuit board 430 and the second flexible printed circuit board 440.

The first flexible printed circuit board 430 may include a first connector 431 attached to an end extending to the first housing 210 and a second connector 432 attached to an end extending to the second housing 220. The second flexible printed circuit board 440 may include a third connector 441 attached to an end extending to the first housing 210 and a fourth connector 442 attached to an end extending to the second housing 220.

The first printed circuit board 410 may be electrically connected to a fifth connector 418 and a sixth connector 419. The fifth connector 418 and the sixth connector 419 may be formed on the second printed circuit board 760. The fourth printed circuit board 420 may include a seventh connector 428 and an eighth connector 429. The fifth connector 418 and the sixth connector 419 may be bonded to a surface of the second printed circuit board 760 to be arranged on the second printed circuit board 760, and the seventh connector 428 and the eighth connector 429 may be bonded to a surface of the fourth printed circuit board 420 to be arranged on the fourth printed circuit board 420.

The fifth connector 418 may be disposed spaced apart from the sixth connector 419, and the fifth connector 418 may be disposed closer to an edge of the body part 411 of the first printed circuit board 410 than the sixth connector 419. The seventh connector 428 may be disposed spaced apart from the eighth connector 429, and the seventh connector 428 may be disposed closer to the body part 421 of the fourth printed circuit board 420 than the eighth connector 429.

The first flexible printed circuit board 430 may be electrically connected to the second printed circuit board 760 with fastening of the fifth connector 418 and the first connector 431, and may be electrically connected to the fourth printed circuit board with fastening of the seventh connector 428 and the second connector 432.

The second flexible printed circuit board 440 may be electrically connected to the second printed circuit board 760 with fastening of the sixth connector 419 and the third connector 441, and may be electrically connected to the fourth printed circuit board 420 with fastening of the eighth connector 429 and the fourth connector 442.

The first flexible printed circuit board 430 may extend from the second housing 220 through the hinge structure 260 to the first housing 210. The first flexible printed circuit board 430 may extend to the first housing 210 through a first opening (e.g., a first opening 321 of FIG. 3A) of a first connection passage (e.g., a first connection passage 310 of FIG. 3A), and may extend to the second housing 220 through a second opening (e.g., a second opening 322 in FIG. 3A) of the first connection passage 310 to be electrically connected to the fourth printing circuit board 420.

The first flexible printed circuit board 430 may extend from the second housing 220 through the hinge structure 260 to the first housing 210 to be electrically connected to the first printed circuit board 410. The first flexible printed circuit board 430 may extend to the first housing 210 through a first opening (e.g., a first opening 321 of FIG. 3A) of the first connection passage (e.g., a first connection passage 310 of FIG. 3A), and may extend to the second housing 220 through the second opening (e.g., a second opening 312 of FIG. 3A) of the first connection passage 310.

Referring to FIGS. 7 and 8, the electronic device (e.g., an electronic device 101 of FIG. 2A) may include, within a first housing 210, a first supporting member 270, a first printed circuit board 410, a second printed circuit board 760, a portion of a second flexible printed circuit board 440, and a first sealing member 710 of the first housing 210, and may include, within a second housing 220, a second supporting member 280, a fourth printed circuit board 420, another portion of the second flexible printed circuit board 440, and a second sealing member 720 of the second housing 220.

The first supporting member 270 may include a first surface 271 of the first supporting member 270 facing a flexible display panel 230, and a second surface 272 facing the first surface 271. The second surface 272 of the first supporting member 270 may be in contact with one surface of the first printed circuit board 410, and the second printed circuit board 760 may be disposed on the other surface of the first printed circuit board 410. A connector 761 may be mounted on the second printed circuit board 760. The connector 761 of the second printed circuit board 760 (e.g., a sixth connector 419 of FIG. 4) may be coupled to the third connector 441 to be electrically connected to the second flexible printed circuit board 440. The second flexible printed circuit board 440 may extend to the first housing 210 through at least one of the hinge structure 260 or the hinge cover 265. Within the first housing 210, the second flexible printed circuit board 440 may pass through a third opening 327 positioned in the first housing 210. A first sealing structure 741 (including 741-1 and 741-2) may surround a space defined by the third opening 327 and through which a portion of the second flexible printed circuit board 440 passes. For example, the first sealing structure 741 may include the third opening 327 passing through the first supporting member 270. The third opening 327 may be a through hole having a certain length. The second flexible printed circuit board 440 may pass through the third opening 327. The third opening 327 may surround a portion of the second flexible printed circuit board 440.

The first sealing member 710 may be configured to seal a space between the first sealing structure 741 and a portion of the second flexible printed circuit board 440. The first sealing member 710 may be further configured to block moisture introduced through a gap between the housings from the outside to be transmitted further inside along an extended passage of the flexible printed circuit board (e.g., a first flexible printed circuit board 430 and a second flexible printed circuit board 440). Hereinafter, description will be made to an inflow path of moisture and a waterproof structure using a sealing member.

According to an embodiment of the disclosure, the hinge cover 265, a part of the first housing 210 and a part of the second housing 220 may be spaced apart from each other. Due to that spacing, external moisture may be introduced into the electronic device 101. The moisture introduced into the electronic device 101 may be transferred along a passage through which the second flexible printed circuit board 440 extends. For example, the second flexible printed circuit board 440 may extend to the first housing 210 through the inner space of the hinge cover 265, and may further extend along a passage formed with a space between the flexible display panel 230 and the first supporting member 270 of the first housing 210. The third connector 441 may be disposed at an end of the second flexible printed circuit board.

Moisture introduced into the electronic device may move to an area in which the first sealing structure 741 is located, along the space between the first supporting member 270 of the first housing 210 and the flexible display panel 230, which space may be of an extended passage of the second flexible printed circuit board 440.

According to an embodiment of the disclosure, the first sealing member 710 may be configured to seal the space between the first sealing structure 741 and the second flexible printed circuit board 440, so as to close a connection passage formed by the third opening 327 of the first sealing structure 741. For example, the first sealing member 710 may be configured to close the moisture path introduced into the first housing 210, so as to prevent the moisture from flowing into the first printed circuit board 410, the second printed circuit board 760, the first connector 761, the third connector 441, and/or the first battery 491.

A fourth printed circuit board 420 may be disposed on the second supporting member 280, and the second connector 762 may be mounted on the fourth printed circuit board 420. The second connector 762 may be coupled to the fourth connector 442 extending from the second flexible printed circuit board 440. The second flexible printed circuit board 440 may extend to the second housing 220 via at least one of the hinge structure 260 or the hinge cover 265. Within the second housing 220, the second flexible printed circuit board 440 may pass through the fourth opening 328 of a second sealing structure 742 (including 742-1 and 742-2) positioned in the second housing 220. The second sealing structure 742 may include a space through which the fourth opening 328 passes. A part of the second flexible printed circuit board 440 may pass through the fourth opening 328. The second sealing member 720 may be configured to seal a space between the second sealing structure 742 and a part of the second flexible printed circuit board 440.

According to an embodiment of the disclosure, the second sealing member 720 may be configured to seal a space between the fourth opening 328 of the second sealing structure 742 and the second flexible printed circuit board 440, so as to close an advance path of moisture toward the sealing structure 742, thereby preventing the moisture from further proceeding to the fourth printed circuit board 420 or the second battery 492.

The first printed circuit board 410 may include the third printed circuit board 520, the interposer 510, and the shield can 530, on the upper surface, as seen in FIGS. 5 and 6. The first printed circuit board 410 may include the third printed circuit board 520, the interposer 510 and the shield can 530 that are stacked with a certain thickness, so that it can be arranged closer to the flexible display panel 230 than the fourth flexible printed circuit board 420. The first sealing member 710 and the second sealing member 720 may be formed to have a certain thickness required for waterproof performance, and the first sealing structure 741 and the second sealing structure 742 may be formed with a height corresponding to the first sealing member 710 and the second sealing member 720, respectively. The first sealing member 710 and the second sealing member 720 may be referred to as a waterproof member, respectively.

The height of the upper surface of the first printed circuit board 410 and the height of the upper surface of the first sealing member 710 may be different from each other. Multiple layers or electronic components may be stacked on the upper surface of the first printed circuit board 410, so that the upper surface of the first printed circuit board 410 may be more biased to the first surface 211 of the first housing 210 than the first sealing member 710. Due to the biasing toward the first surface 211 of the first printed circuit board 410, a step difference of a different height may be formed between the upper surface of the first printed circuit board 410 and the first sealing member 710. This step difference may be compensated by stacking the second printed circuit board 760 on the first printed circuit board 410.

For example, the distance from the upper surface of the first printed circuit board 410 to the upper surface of the first sealing member 710 may be greater than the distance from the second printed circuit board 760 to the first sealing member 710. The second printed circuit board 760 may be stacked on the first printed circuit board 410 to compensate for the distance from the upper surface of the first printed circuit board 410 to the upper surface of the first sealing member 710, thereby reducing the step difference. For example, in order to compensate for the step difference, in sequence in a direction from the flexible display panel 230 toward the rear plate 290, a first printed circuit board 271 may be sequentially stacked on the first supporting member 271, the second printed circuit board 760 may be stacked on the first printed circuit board 271, and the third connector 441 of the second flexible printed circuit board 440 may be stacked on the second printed circuit board 760. For compensating for the distance between the third connector 441 and the first printed circuit board 410, the second printed circuit board 760 may be configured to be stacked on a portion of the body part 411 and at least a portion of the neck part 412. The second printed circuit board 760 may include a body part 771 and a neck part 772. The body part 771 of the second printed circuit board 760 may be a portion disposed between the upper edge of the first battery 491 and the upper edge of the first housing 210. The neck part 772 of the second printed circuit board 760 may be a portion disposed between the folding axis and an edge adjacent to the folding axis among the edges of the first battery 491. The neck part 772 of the second printed circuit board 760 may have a shape corresponding to the neck part 412 of the first printed circuit board 410.

For example, when viewed from the second surface 212 of the first housing 210, the body part 771 of the second printed circuit board 760 may overlap a portion of the body part 411 of the first printed circuit board 410 and a portion of the neck part 412 of the first printed circuit board 410. When viewed from the second surface 212 of the first housing 210, the neck part 772 of the second printed circuit board 760 may overlap at least some of the remaining portion distinct from the portion of the neck part 412 of the first printed circuit board 410. The neck part 772 of the second printed circuit board 760 may include a plurality of connectors (e.g., a fifth connector 418 and a sixth connector 419 of FIG. 4). Among the plurality of connectors of the second printed circuit board 760, the fifth connector 418 adjacent to the body part (e.g., a body part 411 of FIG. 4) may be connected to the first connector 431 of the first flexible printed circuit board 430, and the sixth connector 419 may be connected to the third connector 441 of the second flexible printed circuit board 440.

Referring to FIGS. 7 and 8, description has been mainly made to the second flexible printed circuit board 440, but the first flexible printed circuit board 430 may be the same as or similar to the second flexible printed circuit board 440. For example, an arrangement may be made so that the structures of the first flexible printed circuit board 430 and the second flexible printed circuit board 440 may be substantially the same as each other, the structures of the third opening 327 of the first sealing structure 741 and the fourth opening 328 of the second sealing structure 742, through which the second flexible printed circuit board 440 passes, may be substantially the same as each other, and likewise, the structures of the first sealing member 710 and the second sealing member 720 may be substantially the same as each other.

Referring to FIGS. 5 and 7, the interposer 510, the third printed circuit board 520, and the shield can 530 may be sequentially stacked on the first printed circuit board 410. The sum of the heights of those members stacked on the first printed circuit board 410 may be referred to as 'd1' A shield can 532 may be stacked on the fourth printed circuit board 420, and the sum of the heights of the members (i.e., 593) stacked on the fourth printed circuit board 420 may be referred to as 'd2'. A multiplicity of electronic components may be arranged on the first printed circuit board 410, and thus, it may include a structure (e.g., a shield can, an interposer) for mounting the same. Due to such a mounting structure, d1 may be greater than d2. Accordingly, the first printed circuit board 410 may be disposed closer to the flexible display panel 230 than the second printed circuit board 420. For example, a distance 'd3' between the upper surface of the first printed circuit board 410 and the flexible display panel 230 may be shorter than a distance 'd4' between the upper surface of the fourth printed circuit board 420 and the flexible display panel 230. In order to compensate for the difference in between d3 and d4, the second printed circuit board 420 may be attached to the first printed circuit board 410.

According to the above-described embodiment of the disclosure, the electronic device 101 makes it possible to prevent moisture introduced through the hinge structure 260 from coming into the inside of the device through a connection passage of the flexible printed circuit board. Although some moisture may be introduced through a gap between the hinge structure 260 and the first supporting member 270 and the second supporting member 280, the sealing structure 741 filled with the sealing members 710 and 720 can block the inflow passage of moisture. The first printed circuit board 410 may be disposed closer to the flexible display panel 230 than the fourth printed circuit board 420. When the first printed circuit board 410 is connected to the second flexible printed circuit board 440, the second flexible printed circuit board 440, it may be formed a portion in which the second flexible printed circuit board 440 is sharply bent, in a section in which the second flexible printed circuit board 440 extends to the connector, owing to the height of a connection passage (e.g., a sealing structure) formed on the sidewall (e.g., a first sidewall 341 of FIG. 3A) through which the second flexible printed circuit board 440 passes. In the section where the flexible printed circuit board is sharply bent, the layer forming the flexible printed circuit board as well as its internal conductive member may be damaged, and therefore, in order to avoid such abrupt bending of the flexible printed circuit board, it is necessary to minimize the step difference between the sealing member and the printed circuit board on which the connector is mounted. According to an embodiment of the disclosure, the electronic device 101 may be configured to attach the second printed circuit board 760 onto the first printed circuit board 410 to compensate for the step difference between the first printed circuit board 410 and the sealing member 710.

Figure 9A:
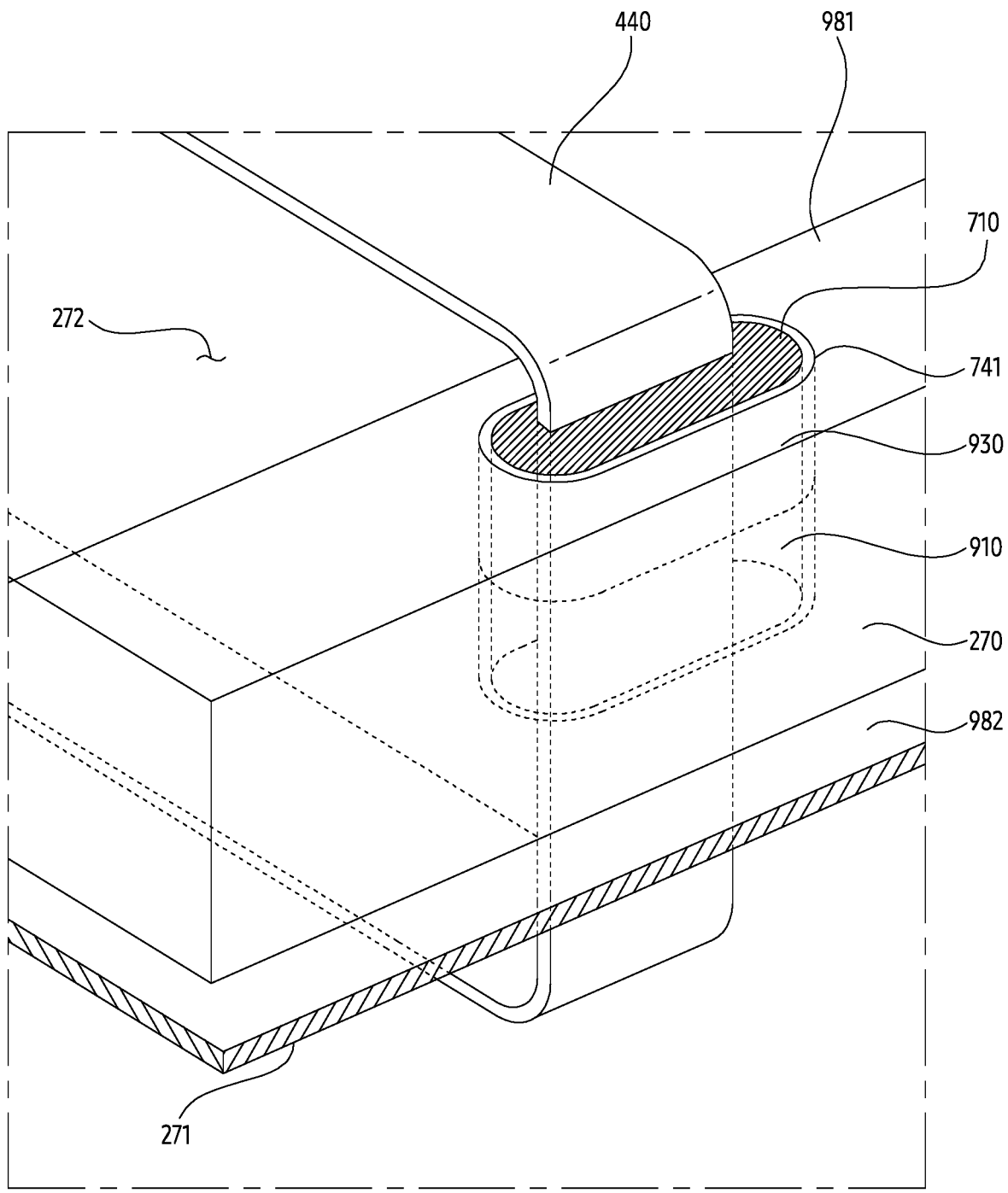
FIG. 9A illustrates a sealing structure formed on a sidewall of a supporting member included in an electronic device according to an embodiment of the disclosure.
Figure 9B:
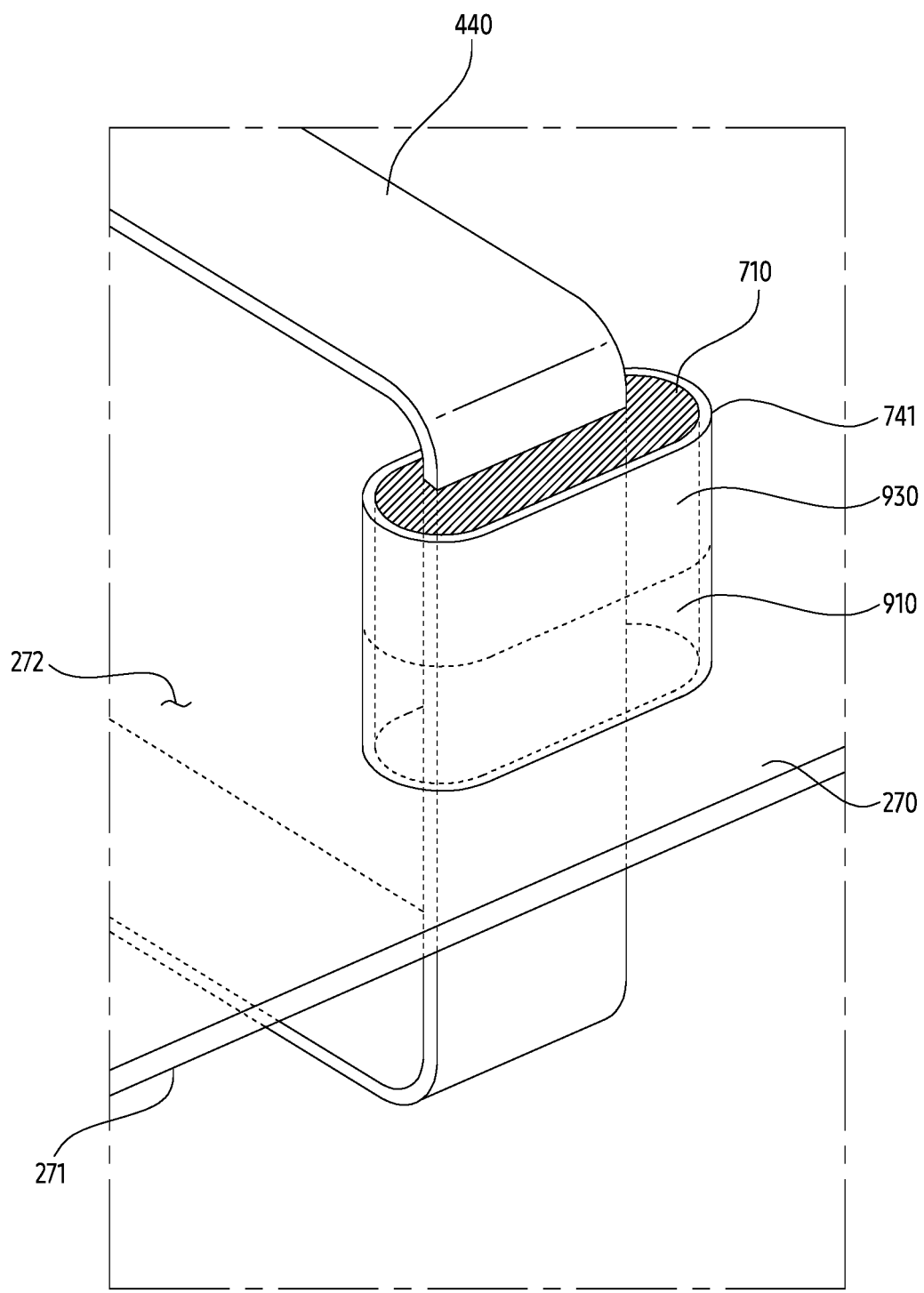
FIG. 9B illustrates a sealing structure extending from a supporting member included in an electronic device according to an embodiment of the disclosure.

FIG. 9A illustrates a sealing structure formed on a sidewall of a supporting member included in an electronic device according to an embodiment of the disclosure. FIG. 9B illustrates a sealing structure extending from a supporting member included in an electronic device according to an embodiment of the disclosure. Further, FIG. 9C is a cross-sectional view of a sealing structure of an electronic device according to an embodiment of the disclosure.

Figure 9C:
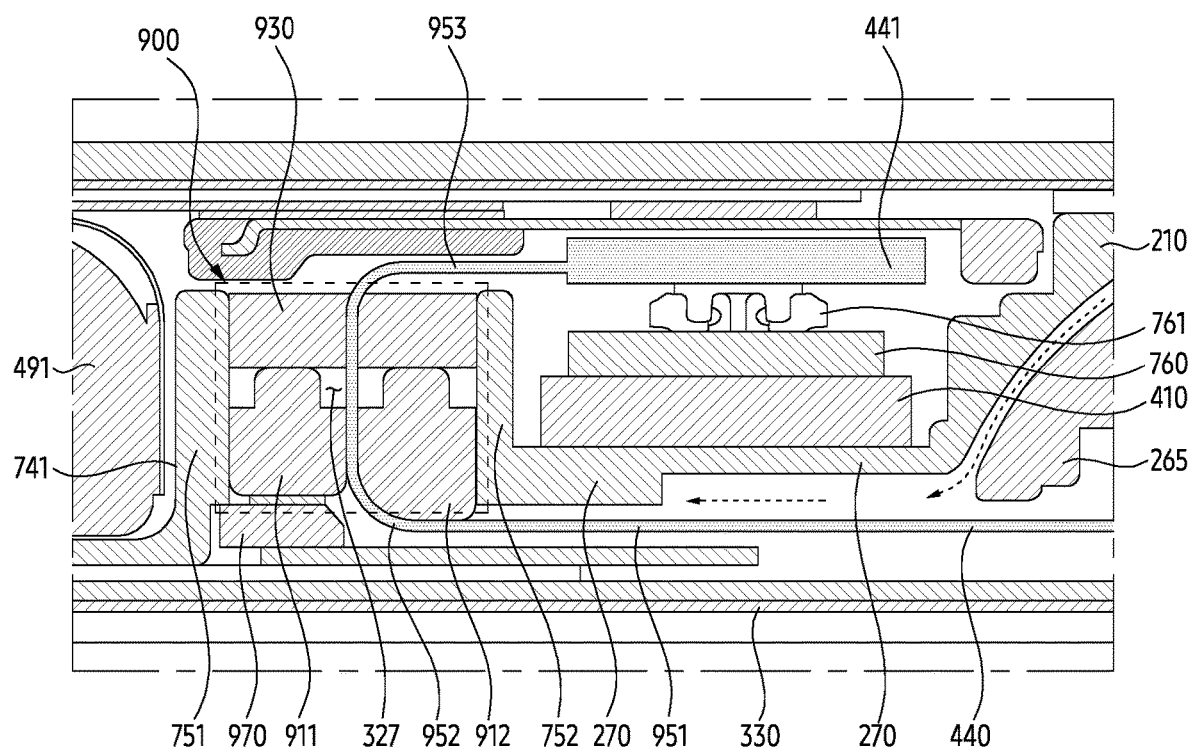
FIG. 9C is a cross-sectional view of a sealing structure of an electronic device according to an embodiment of the disclosure.

Referring now to FIGS. 9A and 9C, an electronic device (e.g., an electronic device 101 of FIG. 1 or an electronic device 101 of FIG. 2A) may include a waterproof area 900. The waterproof area 900 may include a first sealing structure 741 and a first sealing member 710 on the second surface 272 of the first supporting member 270. The first sealing structure 741 may include an opening (e.g., a third opening 327 of FIG. 3A) formed in a sidewall 981 attached to the second surface 272 of the first supporting member 270. The first supporting member 270 may include a first surface 271 facing the flexible display 330 and a second surface 272 facing the first surface 271. The first supporting member 270 may include a surface 982 (e.g., a first battery supporting part 351 of FIG. 3A) on which a battery or an electronic component is disposed, in a side of the sidewall 981. The surface 982 on which a battery or an electronic component is disposed may be a surface facing the same direction as the second surface 272 of the first supporting member 270.

The above-described configuration may be the same as the second sealing structure 742 and the second sealing member 720 of the second supporting member 280 through which the second flexible printed circuit board 440 passes. The sealing structure in an area through which the first flexible printed circuit board 430 passes may be the same as the above-described sealing structure 741.

According to an embodiment of the disclosure, the second flexible printed circuit board 440 passing through the opening 327 of the sealing structure 741 may be configured to fill the inside of the opening 327 (e.g., a through-hole) with the sealing member 710 to prevent passing of moisture therethrough and fix the second flexible printed circuit board 440. The sealing structure 741 may provide in its lower part a space for disposing a lower sealing member 910 including rubber, and in its upper part a space for disposing an upper sealing member 930 including curable resin, such as e.g., CIPG.

Referring to FIGS. 9B and 9C, the electronic device (e.g., an electronic device 101 of FIG. 1 or an electronic device 101 of FIG. 2A) may include a waterproof area 900. The waterproof area 900 may include a first sealing member 710 and a first sealing structure 741 having ribs or walls extending from the second surface 272 of the first supporting member 270 toward the second surface 212 of the first housing 210. The above-described configuration may be the same as the second sealing member 720 and the second sealing structure 742 of the second supporting member 280 through which the second flexible printed circuit board 440 passes, and the area through which the first flexible printed circuit board 440 passes may be configured to implement the waterproof structure with the same configuration as the second flexible printed circuit board 440.

According to an embodiment of the disclosure, the second flexible printed circuit board 440 penetrating the inner space of the sealing structure 741 may be filled with the sealing member 710 to prevent the passing of moisture. The first sealing structure 741 may be configured to provide in its lower part a space for positioning the lower sealing member 910 including rubber, and provide in its upper part a space for positioning the upper sealing member 930 including curable resin.

The lower sealing member 910, which may be substantially formed of rubber, may include a plurality of rubbers. The plurality of rubbers may be formed to fill up a space between the first sealing structure 741 and the second flexible printed circuit board 440 to prevent inflow of moisture from the outside. According to an embodiment of the disclosure, the plurality of rubbers may be formed to apply an external force to the first sealing structure 741 and the second flexible printed circuit board 440 and fix the second flexible printed circuit board 440 to prevent their movement in the space.

Referring to FIG. 9C, the electronic device 101 may include a first supporting member 270 forming part of the first housing 210, a hinge cover 265, a first printed circuit board 410, a second flexible printed circuit board 440, a first battery 491, first sidewalls 752 and second sidewalls 751 making up a sealing structure 741, and a waterproof area 900.

The electronic device 101 may include a flexible display 330. A surface of the flexible display 330 facing the inside of the electronic device 101 may be in contact with the first supporting member 270. The first supporting member 270 may be configured to support the first printed circuit board 410 and the first battery 491.

The first printed circuit board 410 may support the second printed circuit board 760. For example, the second printed circuit board 760 may be attached to an upper surface of the first printed circuit board 410. The first sealing structure 741 may be disposed between the battery 491 and the first printed circuit board 410 along edges of the first printed circuit board 410 and the second printed circuit board 760. The first sealing structure 741 may include a first sidewall 752 supporting the first printed circuit board 410 and the second printed circuit board 760, and a second sidewall 751 facing the first sidewall 752 and supporting the first battery 491. The second sidewall 751 may support the first battery 791 together with the first supporting member 270.

The waterproof area 900 may include a first sealing structure 741, a first sealing member 912, a second sealing member 911, and an upper sealing member 930. The first sealing structure 741 may be configured to have the sealing member in a through hole formed as an opening 327 therein. The first sealing member 912 may fill a space between the first sidewall 752 and the second flexible printed circuit board 440. The second sealing member 911 may fill a space between the second sidewall 751 and the second flexible printed circuit board 440. The first sealing member 912 and the second sealing member 911 may include a rubber material. The first sealing member 912 and the second sealing member 911 may have elasticity, and therefore, the first sealing member 912 and the second sealing member 911 may be adapted to be fixed to each other, by applying a compressive force to each other. For example, the first sealing member 912 may be fixed by a compressive force provided by the sidewall of the first sealing structure 741, the second sealing member 911, and the second flexible printed circuit board 440. The first sealing member 912 and the second sealing member 911 may provide a compressive force capable of fixing the second flexible printed circuit board 440.

The first sealing member 912 and the second sealing member 911 may be disposed in an inner space surrounded by the first sealing structure 741 defined by the first sidewall 752 and the second sidewall 751 to wrap a part of the second flexible printed circuit board 440. The upper sealing member 930 may be applied on the first sealing member 912 and the second sealing member 911. The upper sealing member 930 may include a cured in placed gasket (CIPG). After being applied, the upper sealing member 930 may undergo a curing process to fix the first sealing member 912 and the second sealing member 911. The upper sealing member 930 may be configured to fill up a probable minute gap between the first sealing member 912 and the second sealing member 911 and fix the first sealing member 912 and the second sealing member 911. The upper sealing member 930 may wrap up a portion of the second flexible printed circuit board 440 to seal a space between the flexible printed circuit board and the first sealing structure 741.

The second sealing member 911 may be supported by a protrusion 970. The protrusion 970 may be formed to protrude from an end of the second sidewall 751 in contact with one surface of the first supporting member 270 into the first sealing structure 741. The protrusion 970 may be integrally formed with the first supporting member 270. However, the configuration is not limited thereto, and the protrusion 970 may be formed separately from the first supporting member 270. The position of the second sealing member 911 may be determined based on the protrusion 970. The first sealing member 912 may provide a force for fixing the second sealing member 911 in the space within the first sealing structure 741.

The second flexible printed circuit board 440 may include a first extension 951 configured to extend along a surface on which the flexible display 330 is arranged toward a side of the electronic device 101, so that the second flexible printed circuit board 440 pass through the hinge structure 260 to extend into the first housing 210. The first extension 951 may extend along a space between the flexible display 330 and the first supporting member 270 to an area where the first sealing structure 741 is disposed. The second flexible printed circuit board 440 may include a second extension 952 bent in an area where the first sealing structure 741 is disposed, and extending toward the second surface 212 of the first housing 210 from one end of the first sealing structure 741 to the other end thereof. The second extension 952 may be inserted into the first sealing structure 741 to pass through the waterproof area 900. The second extension 952 may be fixed by the first sealing member 912, the second sealing member 911 and the upper sealing member 930, which are arranged in the waterproof area 900. The second flexible printed circuit board 440 may include a third extension portion 953 bent from the second extension 952 and extending parallel to the flexible display 330 toward the hinge cover 265. The third extension portion 953 may be connected to a first lower connector (e.g., the third connector 441) at an end facing the hinge cover 265. The first lower connector (e.g., the third connector 441) may be connected to the connector 761 mounted on the second printed circuit board 760.

According to an embodiment of the disclosure, the electronic device 101 makes it possible to prevent moisture from flowing into the first printed circuit board 410 and the second printed circuit board 760, on which various electronic components constituting the electronic device are arranged, thanks to the waterproof area 900 capable of blocking inflow of the moisture. For example, moisture may be introduced into the first housing 210 through a gap between the first supporting member 270 and the hinge cover 265. The moisture introduced into the first housing 210 may be carried to the waterproof area 900 along the space between the flexible display 330 and the first supporting member 270. Moisture that has reached the waterproof area 900 may not proceed further owing to the first sealing member 912, the second sealing member 911, and the upper sealing member 930.

Further, the waterproof area 900 may be also disposed in a space of a waterproof rib surrounding a portion of both sides of the first flexible printed circuit board 430, and/or may be also disposed in a space passing through a waterproof rib surrounding another area of the second flexible printed circuit board 440 other than the aforementioned area of the second flexible printed circuit board 440.

The electronic device according to the above-described embodiment makes it possible to have the first sealing member 911 and the second sealing member 912 fixed by applying pressure to each other, thereby preventing the movement of the second flexible printed circuit board 440. According to an embodiment of the disclosure, the upper sealing member 930 applied on the first sealing member 911 may be formed of waterproof resin, and fill up even a narrow space between the first sealing member 911 and the second sealing member 912, increasing the adhesive force of the first sealing member 911, the second sealing member 912, and the second flexible printed circuit board 440. As described above, as the structure of the first sealing member 911, the second sealing member 912, and the upper sealing member 930 forms a fully sealed waterproof area 900, it is possible to block the inflow of moisture, and prevent malfunction of the electronic device.

When the second printed circuit board 760 provided to compensate for the step is attached, the rigidity of the first printed circuit board 410 can improve, and thus, it is possible to make the neck part 412 of the first printed circuit board 410 thinner, thereby increasing the capacity of the battery.

Figure 10:
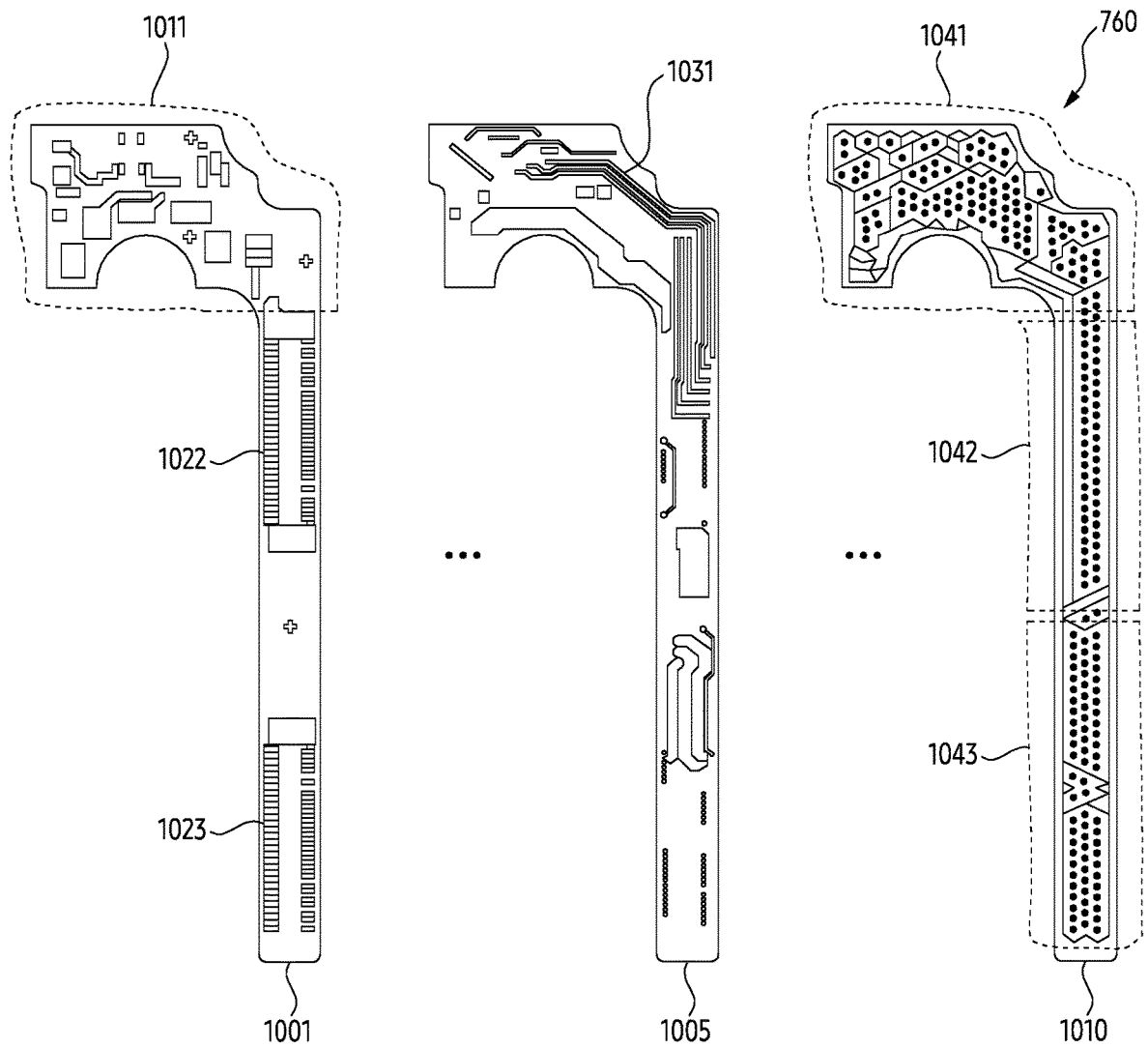
FIG. 10 illustrates a wiring arrangement in a printed circuit board of an electronic device according to an embodiment of the disclosure.

FIG. 10 illustrates a wiring arrangement in a printed circuit board of an electronic device according to an embodiment of the disclosure.

Referring to FIG. 10, the second printed circuit board 760 may be formed of a plurality of layers. The uppermost layer 1001 of the second printed circuit board 760 may include an area 1011 on which contacts electrically connected to components of a first printed circuit board (e.g., a first printed circuit board 410 of FIG. 4), connectors (e.g., C-clip or pin connector), and the like are arranged. The neck part (e.g., a neck part 772 of FIG. 8) of the uppermost layer 1001 of the second printed circuit board 760 may include connectors 1022 and 1023 for connecting to connectors (e.g., a first connector 431 and a third connector 441 of FIG. 4) of the flexible printed circuit board (e.g., a first flexible printed circuit board 430 and a second flexible printed circuit board 440 of FIG. 4).

According to an embodiment of the disclosure, the area 1011 of the uppermost layer 1001 of the second printed circuit board 760 may include a connector or a contact for transmitting an antenna signal. For example, the area 1011 of the uppermost layer 1001 may include a connector connected to a wireless communication module (e.g., a wireless communication module 192 of FIG. 1) and/or a contact connected to an antenna 285. For example, the flexible printed circuit board connected to the wireless communication module 192 may be electrically connected to the second printed circuit board 760 via the connector disposed on the area 1011. A signal supplied from a processor (e.g., a communication processor) mounted on the first printed circuit board (e.g., a first printed circuit board 410 of FIG. 4) may be transmitted to the outside through the wireless communication module 192.

As another example, the second printed circuit board 760 may be electrically connected to an antenna (e.g., an antenna 285 of FIG. 2C) through the contact. The antenna 285 may include a near field communication (NFC) antenna, a wireless charging antenna, and/or a magnetic secure transmission (MST) antenna. The second printed circuit board 760 may be configured to provide a path through which a signal received from the antenna is transmitted, through the contact.

According to an embodiment of the disclosure, the lowermost layer 1010 of the second printed circuit board 760 may include a first area 1041, a second area 1042, and a third area 1043. The lowermost layer 1010 of the second printed circuit board 760 may include a plurality of pins.

According to an embodiment of the disclosure, the first area 1041 may be an area corresponding to the body part 771 of the second printed circuit board 760. In the first area 1041 may be arranged a plurality of pins for use in transmitting and receiving signals via the flexible printed circuit board through an upper connector 1022 positioned above among a plurality of pins. For example, in the first area 1041 may be included a wireless communication module 190, an antenna module (e.g., an antenna module 197 of FIG. 1), an antenna 285, a battery (e.g., a first battery 491 of FIG. 4) and/or pins for electrically connecting to a mobile industry processor interface (MIPI). In the first area 1041 may be arranged the pins related to an antenna signal with many wirings, and in an intermediate layer 1005 may be densely arranged a number of wirings connected to the first area.

The second area 1042 may be an area corresponding to the area in which the upper connector 1022 is disposed. Pins arranged in the second area 1042 may include pins related to both the signals transmitted through the upper connector 1022 and the signals transmitted through the lower connector. For example, in the second area 1042 may be included pins related to the wiring supplying VPH_PWR power for supplying power to the first battery 491 and the entire system. Supplying of the power makes it possible to perform wireless charging.

The third area 1043 may be an area corresponding to the area in which the lower connector 1023 is disposed. Pins arranged in the area in which the lower connector 1023 is disposed may include pins related to the signals transmitted through the lower connector 1023. For example, in the third area 1043 may be arranged pins related to the wiring for transmitting a signal to or receiving a signal from a digitizer, and the signal transmission/reception to/from the digitizer may be made through the lower connector 1023.

According to an embodiment of the disclosure, the intermediate layer 1005 of the second printed circuit board 760 may include a wiring structure 1031. In the wiring structure 1031, a wiring for transmitting a signal transferred from the upper connector 1022 may extend to the body part 771.

In the electronic device 101 according to the above-described embodiment of the disclosure, the pin related to the upper connector 1022 may be disposed on the body part 771, and the connector for transmitting antenna-related signals related to the upper connector 1022 may be disposed in the body part 771, for reducing the width of the neck part (e.g., a neck part 412 of FIG. 4) of the first printed circuit board (e.g., a first printed circuit board 410 of FIG. 4). Therefore, reducing the width of the neck part 412 of the first printed circuit board 410 makes it possible to increase the capacity of the battery (e.g., a first battery 491 of FIG. 4).

Figure 11:
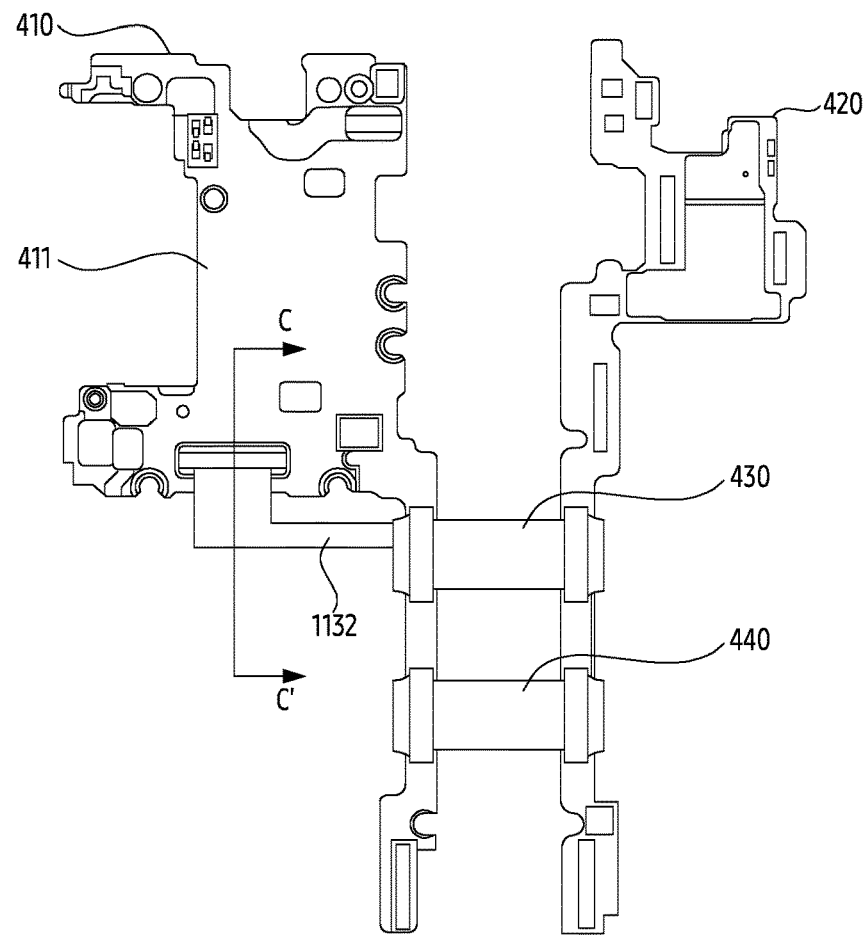
FIG. 11 illustrates one flexible printed circuit board being connected to a plurality of printed circuit boards in a first housing according to an embodiment of the disclosure.
Figure 11:
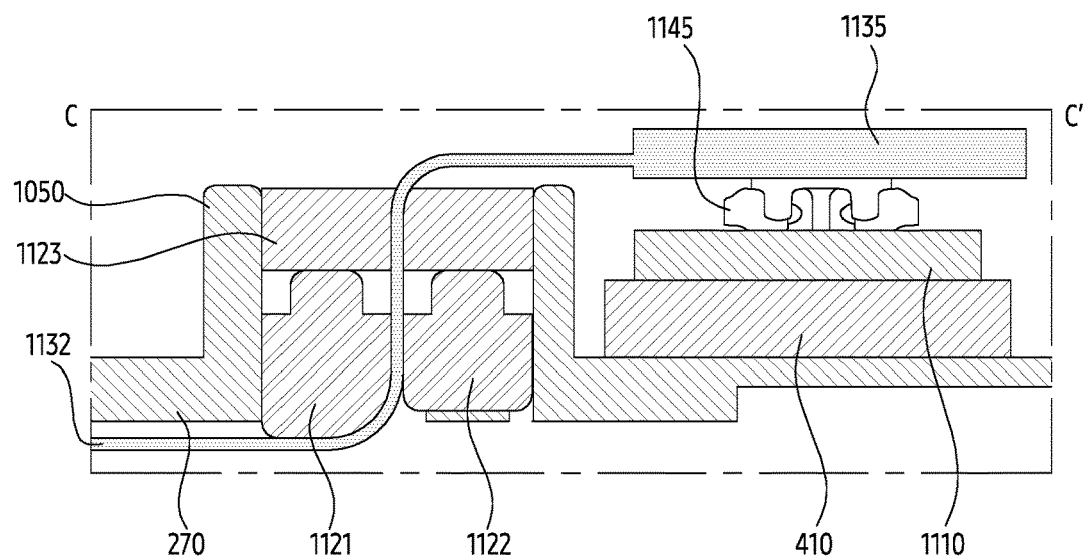

FIG. 11 illustrates a flexible printed circuit board being connected to a plurality of printed circuit boards in a first housing according to an embodiment of the disclosure.

Referring to FIG. 11, the electronic device 101 may include a first flexible printed circuit board 430 and a second flexible printed circuit board 440 for electrically connecting a first printed circuit board 410 and a fourth printed circuit board 420. The first flexible printed circuit board 430 and the second flexible printed circuit board 440 may be connected to a connector positioned at a neck part of the first printed circuit board 410 and the fourth printed circuit board 420. The first flexible printed circuit board 430 may further include an extended flexible printed circuit board 1132 that may be connected to a connector located in some area of a body part 411 of the first printed circuit board 410.

Even when the extended flexible printed circuit board 1132 of the first flexible printed circuit board 430 extends through an opening formed in a side supporting member, it may pass through a waterproof area and a non-waterproof area, so that the electronic device 101 may include the same waterproof structure as its cross-sectional view.

Looking at the cross-sectional view of C-C', it is seen that the first supporting member 270 may support the printed circuit board 410 and a further printed circuit board 1110. A connector 1145 may be disposed on an upper surface of the further printed circuit board 1110. The connector 1145 may be connected to a connector 1135 of the flexible printed circuit board 1132.

For waterproofing the extended flexible printed circuit board 1132, a space surrounded by a sealing structure 1050 may be filled with a first sealing member 1121, a second sealing member 1122, and a third sealing member 1123 for sealing it.

Similar to the connection of the first flexible printed circuit board 430 and the second flexible printed circuit board 440, the further printed circuit board 1110 may be also utilized. The further printed circuit board 1110 may be disposed on the first printed circuit board 410 to compensate for a step difference formed between an upper surface of the third sealing member 1123 and an upper surface of the first printed circuit board 410.

The position of a protrusion 1160 protruding from the first supporting member 270 may be changed along a direction in which the extended flexible printed circuit board 1132 extends. For example, the extended flexible printed circuit board 1132 may extend in a first direction parallel to a surface of the first supporting member 270. The extended flexible printed circuit board 1132 may extend in the first direction, bending into an internal space of the sealing structure 1050 occupied by the first sealing member 1121, the second sealing member 1122, and the third sealing member 1123 occupy may be bent in and extended into the inner space. The extended flexible printed circuit board 1132 may extend from one end of the sealing structure 1050 to the other end, bending in turn to the first direction at the other end of the sealing structure 1050 to be connected to the connector 1135 of the extended flexible printed circuit board 1132. The sealing structure 105 may be an opening or a through hole formed in a sidewall of the first supporting member 270, and may have a structure configured to extend along an edge of the opening formed in the first supporting member 270 in a vertical direction of the edge.

On the first sealing member 1121 supported by the extended flexible printed circuit board 1132 bent at one end of the sealing structure 1050 may not be disposed any protrusion for supporting the same. The protrusion 1060 may protrude from the area of the sidewall located on the side of the first printed circuit board 410 and the further printed circuit board 1110 among the sidewalls of the sealing structure 1050 toward the opening of the sealing structure 1050. The protrusion 1060 may be formed to support the second sealing member 1122.

According to another embodiment of the disclosure, as opposed to the above-described, when a shield can attached to the upper surface of the first printed circuit board 410 and/or a printed circuit board connected by an interposer, etc. are present in the position point where a connector is attached, in lieu of the further printed circuit board 1110, the connector may be attached to the shield can and/or the printed circuit board connected by the interposer.

Figure 12:
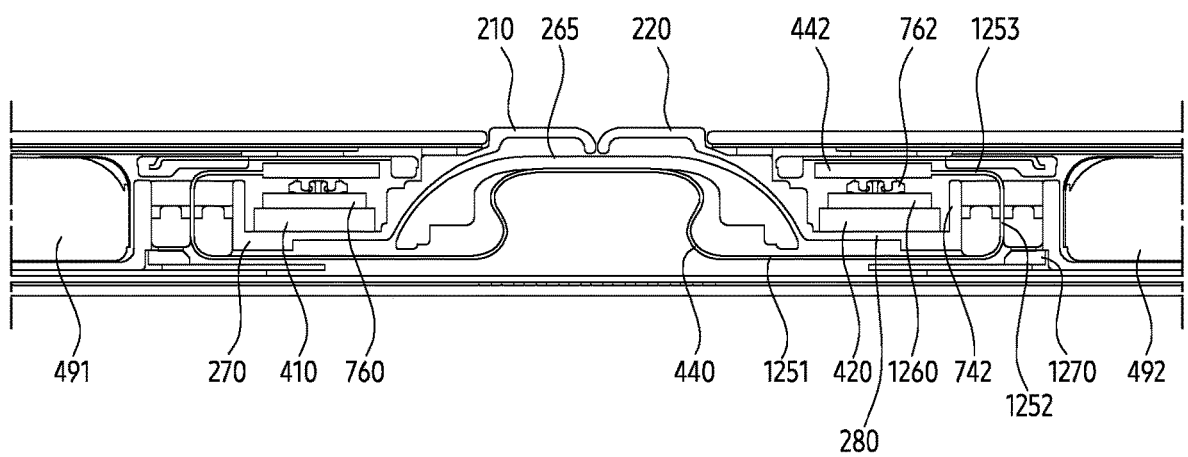
FIG. 12 illustrates an arrangement of a printed circuit board and a sealing member disposed in a second housing of an electronic device according to an embodiment of the disclosure.

FIG. 12 illustrates an arrangement of a printed circuit board and a sealing member disposed in a second housing of an electronic device according to an embodiment of the disclosure.

Referring to FIG. 12, the same configuration as that described in FIGS. 4 to 8, 9A, 9B, 9C, 10, and 11 may be applied to an area where a second printed circuit board 760 supported by a first printed circuit board 410 supported by the first supporting member 270 is disposed.

When the amount of electronic components attached to a fourth printed circuit board 420 increases so that the structure of a shield can, an interposer structure, and so on increase, the fourth printed circuit board 420 may be also disposed close to the flexible display 330. The fourth printed circuit board 420 supported by the second supporting member 280 may be configured to support the further printed circuit board 1260 so as to compensate for a step difference between the fourth printed circuit board 420 and a sealing member 1270.

The second flexible printed circuit board 440 may include a first extension 1251 extending along a space 1253 between the second supporting member 280 and the flexible display 330. The second flexible printed circuit board 440 may include a second extension portion 1252 bending and extending from one end of a second sealing structure 742 in which the sealing member 1270 is present. The second flexible printed circuit board 440 may extend in a direction parallel to the flexible display 330 in an area including the other end of the second sealing structure 742 toward the hinge cover 265 and may be connected to a second connector 762. The second flexible printed circuit board 440 and the first flexible printed circuit board may be configured to have the same structure.

FIGS. 13A, 13B, 13C, and 13D illustrate a sequence of an assembling operation of a sealing member according to various embodiments of the disclosure.

Figure 13A:
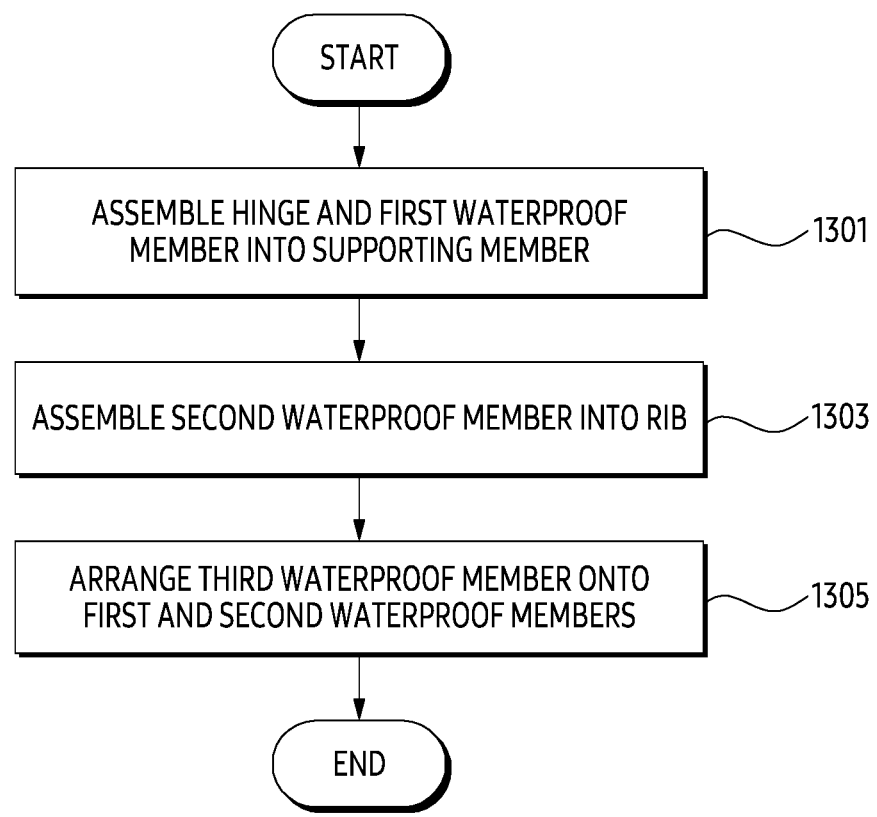
FIGS. 13A, 13B, 13C, and 13D illustrate a sequence of an assembly operation of a sealing member according to various embodiments of the disclosure.
Figure 13B:
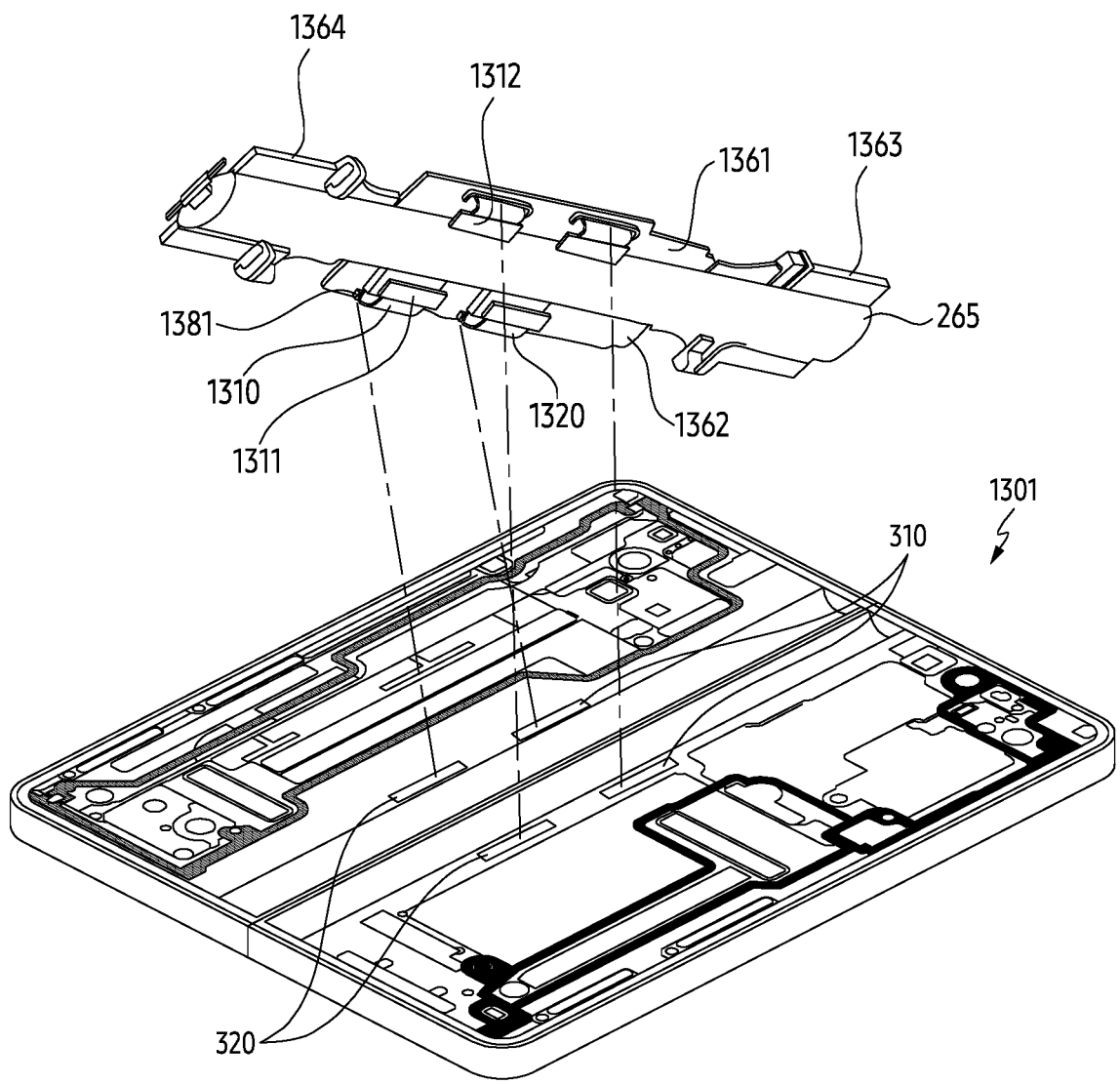

Referring first to FIGS. 13A and 13B, an operation 1301 may include assembling a first sealing member 1381 to a supporting member (e.g., a side supporting member), and assembling the supporting member structure to which the sealing member is assembled, to a hinge structure.

According to an embodiment of the disclosure, after the first sealing member 1381 is assembled to the hinge cover 265 and/or the hinge structure 260 instead of the side supporting member, the first sealing member 1381 and flexible printed circuit boards 1310 and 1320 may be inserted into a rib together. For example, a hinge structure (e.g., a hinge structure 260 of FIG. 2C) may include hinge plates 1361 and 1362, and hinge modules 1363 and 1364 disposed at both ends of the hinge plates 1361 and 1362.

According to an embodiment of the disclosure, rubbers corresponding to the first sealing member 1381 may be assembled to the through holes positioned in the first supporting member 270 and the second supporting member 280. To the assembled supporting member may be assembled the hinge structure (e.g., a hinge structure 260 of FIG. 2C). An assembly of the hinge structure 260 may be coupled to the supporting member after assembling of the hinge structure 260 and the flexible printed circuit boards 1310 and 1320 in advance. The hinge plates 1361 and 1362 may include openings forming a connection passage through which the flexible printed circuit board 1310 passes, and the first sealing member 1381 may be disposed in the openings to be assembled thereto.

The hinge structure 260 and the hinge cover 265 may be assembled to the first housing 210 and the second housing 220, respectively. For example, the first hinge plate 1361 and the first supporting member 270 may be fastened, and assembled to the second hinge plate 1362 and the second supporting member 280.

Figure 13C:
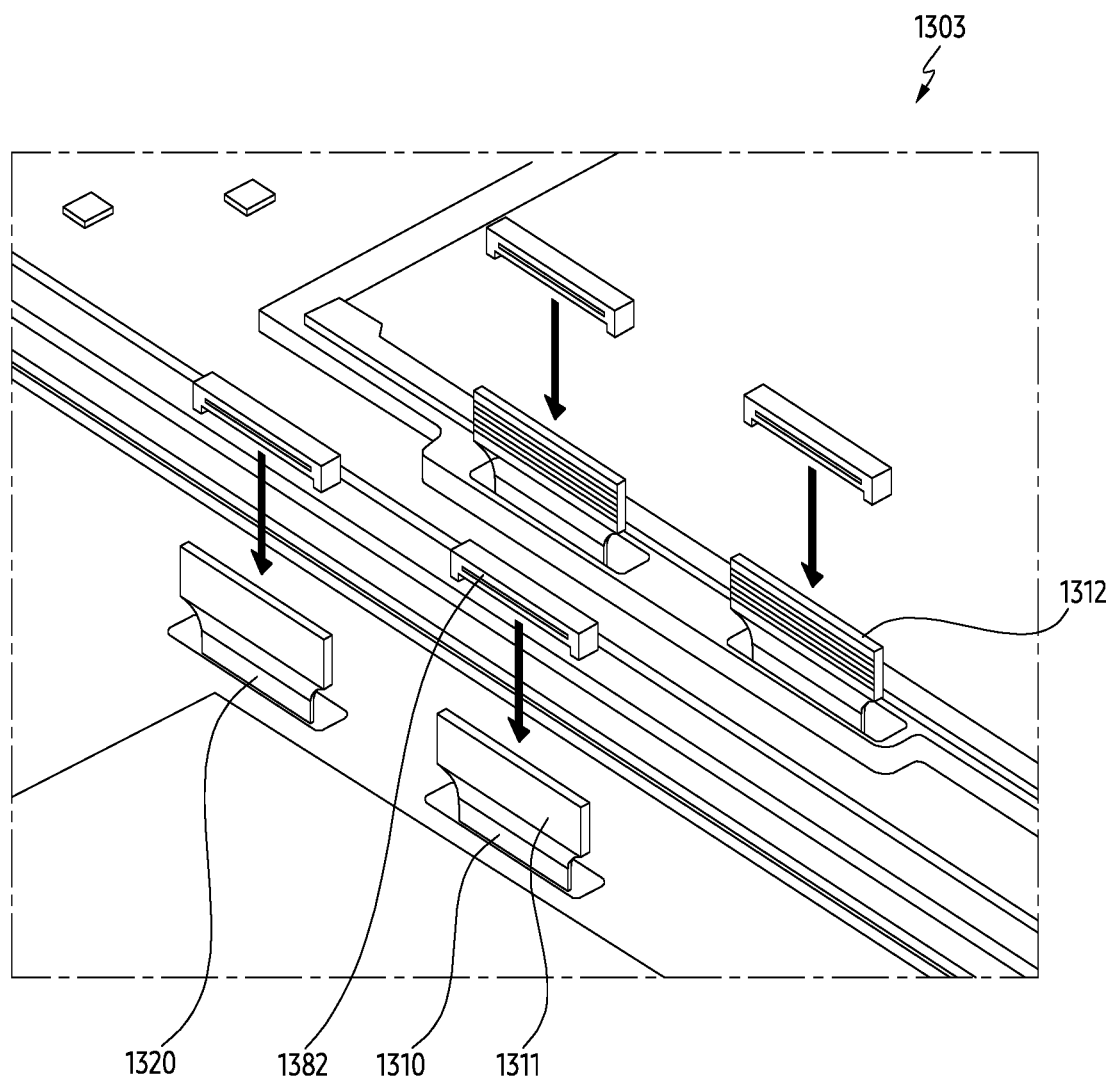

Referring to FIGS. 13A and 13C, in operation 1303, the operation sequence may include assembling the second sealing member to the rib. The flexible printed circuit boards 1310 and 1320 passing through the hinge plates 1361 and 1362 of the hinge structure 260 may be assembled to the first supporting member 270 and the second supporting member 280, so that the connector 1311, 1312 may be disposed to protrude out of the through hole, and the second sealing member 1382 may be inserted into the through hole to fill up a space between the protruded flexible printed circuit board 1310 and the through hole. When the second sealing member 1382 is inserted into the through hole in which the flexible printed circuit board 1310 is located, it may be fixed by a compressive force applied by the first sealing member 1381.

Figure 13D:
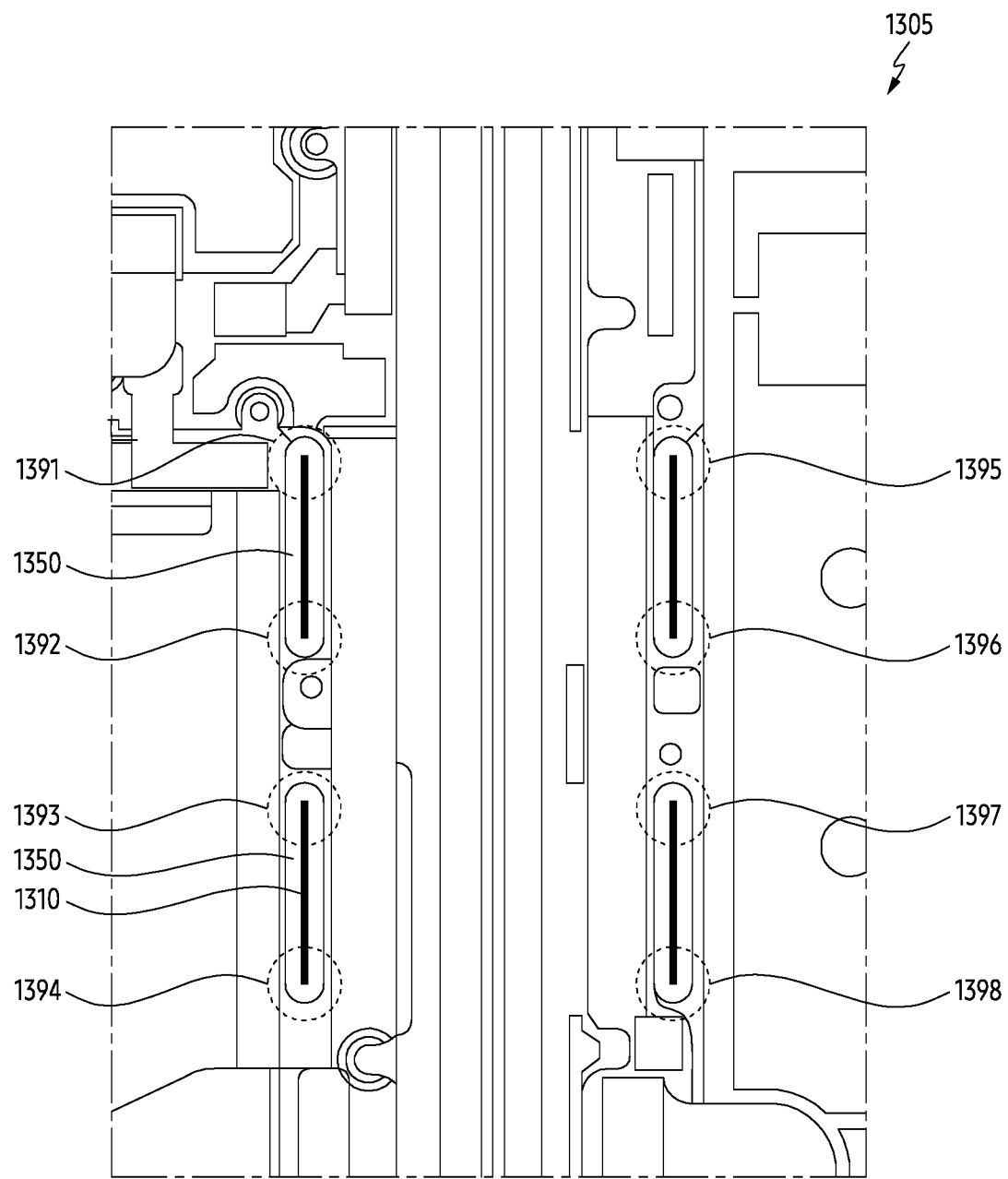

Referring to FIGS. 13A and 13D, an operation 1305 may include applying a third sealing member onto the first sealing member 1381 and the second sealing member 1382. According to an embodiment of the disclosure, the flexible printed circuit board 1310 passing through a rib 1350 may be fixed by the first sealing member 1381 and the second sealing member 1382. A third sealing member may be applied to surround a cable fixed by the first sealing member 1381 and the second sealing member 1382.

The third sealing member may be applied to a plurality of ends 1391, 1392, 1393, 1394, 1395, 1396, 1397 and 1398. Each of the plurality of ends 1391, 1392, 1393, 1394, 1395, 1396, 1397 and 1398 may be a dismal end of the openings forming the ribs 1350.

After applying the third sealing member onto the plurality of ends 1391, 1392, 1393, 1394, 1395, 1396, 1397 and 1398, the operation 1305 may further include a flattening process so that the third sealing member has the same surface as the surface of the ribs 1350. Such a flattening process of the surface makes it possible to provide better adhesive force between the first and second sealing members 1381 and 1382 and the flexible printed circuit board 1310.

The third sealing member may include CIPG, and after filling up a space between the rib and the flexible printed circuit board 1310, it may be cured and fixed.

The sealing member formed through the above process makes it possible to prevent inflow of moisture introduced into a substrate even in case where the flexible printed circuit boards 1311 and 1320 extending through a non-waterproof area (e.g., a hinge structure or a hinge cover including the hinge structure) are connected to the substrate within a housing.

Figure 14A:
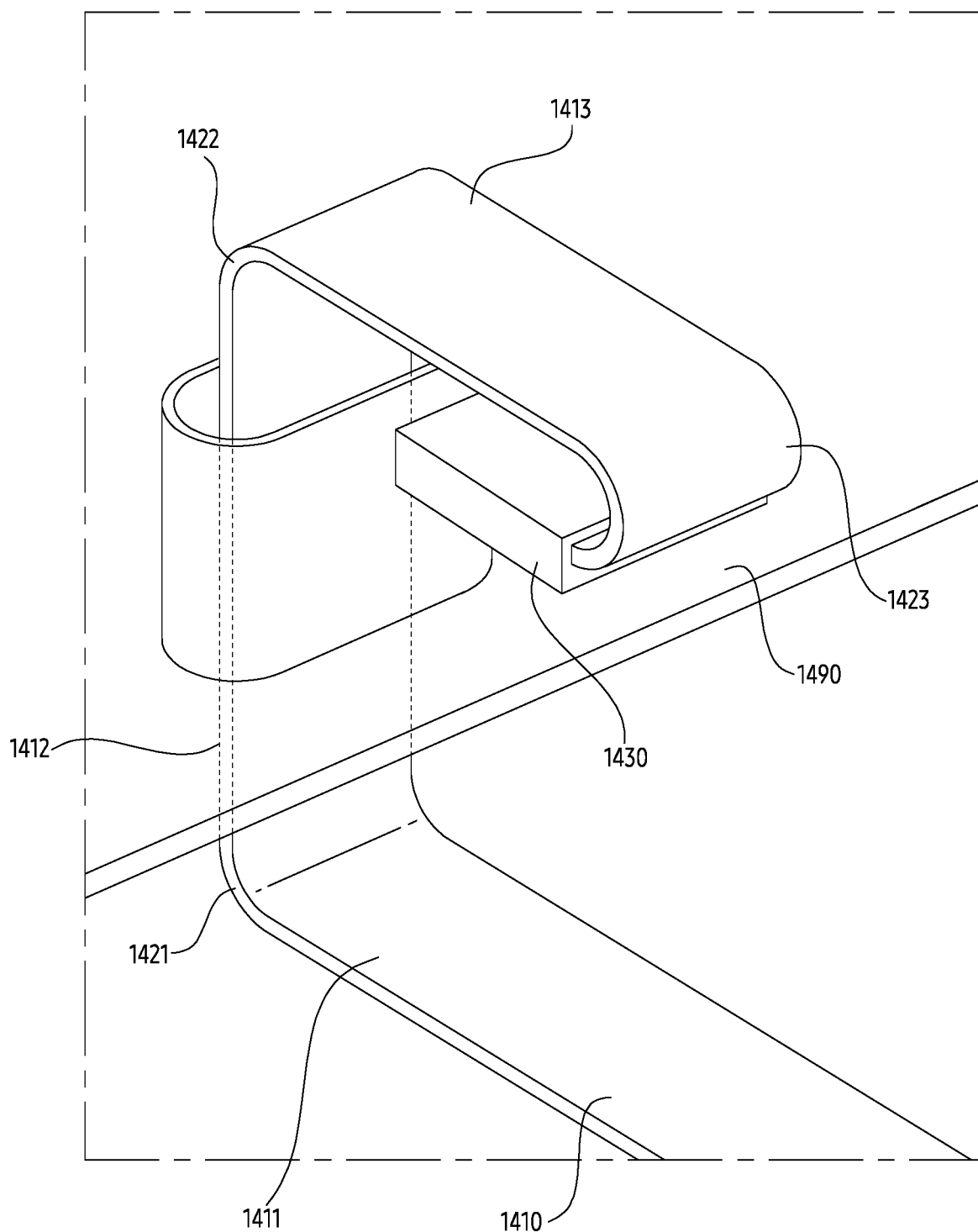
FIGS. 14A and 14B illustrate a flexible printed circuit board passing through a sealing member according to various embodiments of the disclosure.
Figure 14B:
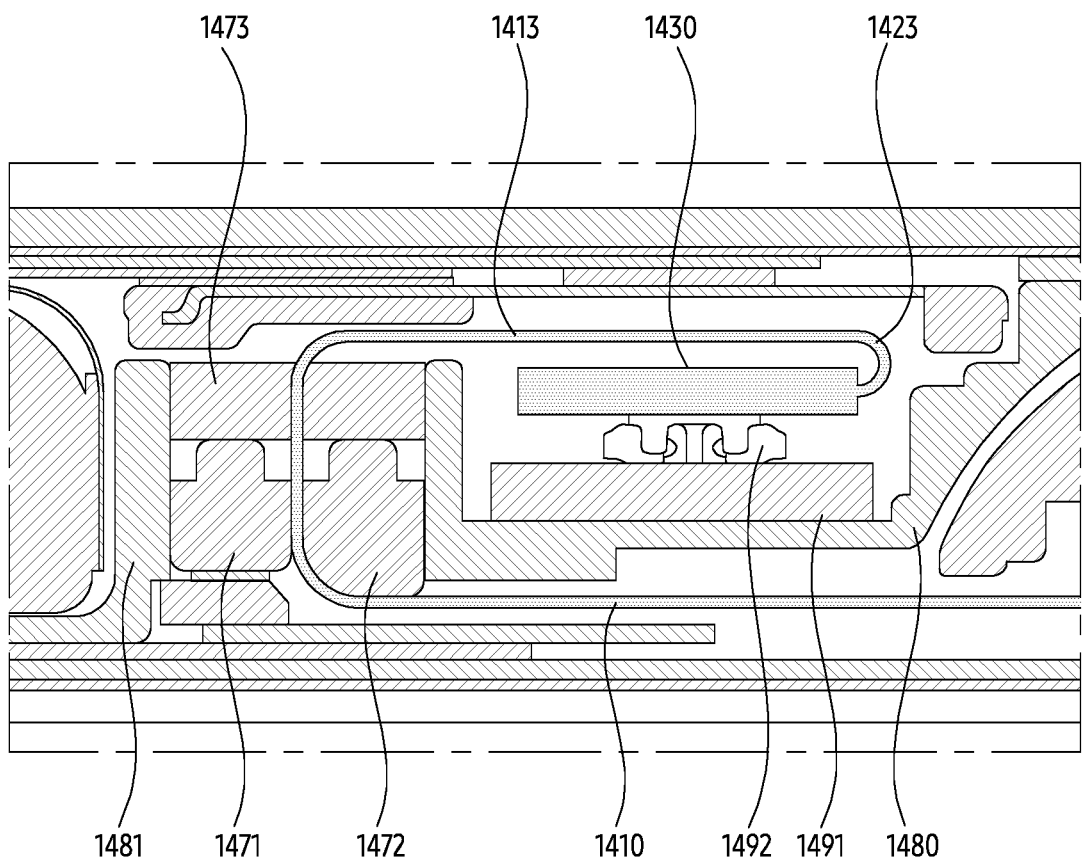

FIGS. 14A and 14B each illustrate a flexible printed circuit board passing through a sealing member according to various embodiments of the disclosure.

Referring to FIGS. 14A and 14B, after passing through a sealing structure 1481, a flexible printed circuit board 1410 may cause a connector 1430 to be lowered to a surface on which the flexible display is positioned, through two times of bending. The flexible printed circuit board 1410 may be configured to include a first extension 1411 extending in a first direction toward the sealing structure 1481, a first bending portion 1421 bent in a second direction perpendicular to the first direction at one end adjacent to the sealing structure 1481 of the first extension 1411, a second extension 1412 extending from the first bent portion 1421 in the second direction toward the sealing structure 1481, a second bending portion 1422 bent in the first direction from a dismal end spaced farther from the supporting member 1490 after passing through the sealing structure 1481 of the second extension 1412, a third extension 1413 extending in the first direction from the second bending portion 1422, and a third bending portion 1423 bent twice at an end of the third extension 1423 or bent in an opposite direction to the first direction.

A step difference between the upper surfaces of a first printed circuit board 1491 and the third sealing member 1473 supported by the supporting member 1490 may be compensated for by the bended and extended distance of the third bending portion. The installed position of the first printed circuit board 1491 may be determined depending on the electronic components mounted onto the upper surface of the first printed circuit board 1491, and the upper surface of the third sealing member 1473 may be determined by the height of the waterproof sealing structure 1481 for implementing the waterproof function. A connector 1492 may be disposed on an upper surface of the first printed circuit board 1491.

The above-described sealing structure 1481 may be formed in a rib structure extending along an edge of an opening formed on one surface of the supporting member 1490, as shown in FIG. 14A. According to an embodiment of the disclosure, the sealing structure 1481 may be configured with a structure having a through hole formed in a sidewall formed on one surface of the supporting member 1490, similar to the sealing structure 741 of FIG. 9A. In an embodiment of the disclosure, the flexible display may be supported by a first supporting member 1480 of the housing.

The electronic device according to the above-described embodiment may use the waterproof assembly including the first sealing member 1471, the second sealing member 1472 and the third sealing member 1473 to prevent the inflow of moisture introduced into the first printed circuit board 1491. The extended printed circuit board 1410 including the third bending portion 1423 either bent twice or reversing its direction makes it possible to secure the connector fastening position lowered by the length of the third bending portion 1423, thereby compensating for the step difference formed between the upper surface of the waterproof assembly (e.g., an upper surface of a third sealing member) and the upper surface of the printed circuit board 1491.

Figure 15A:
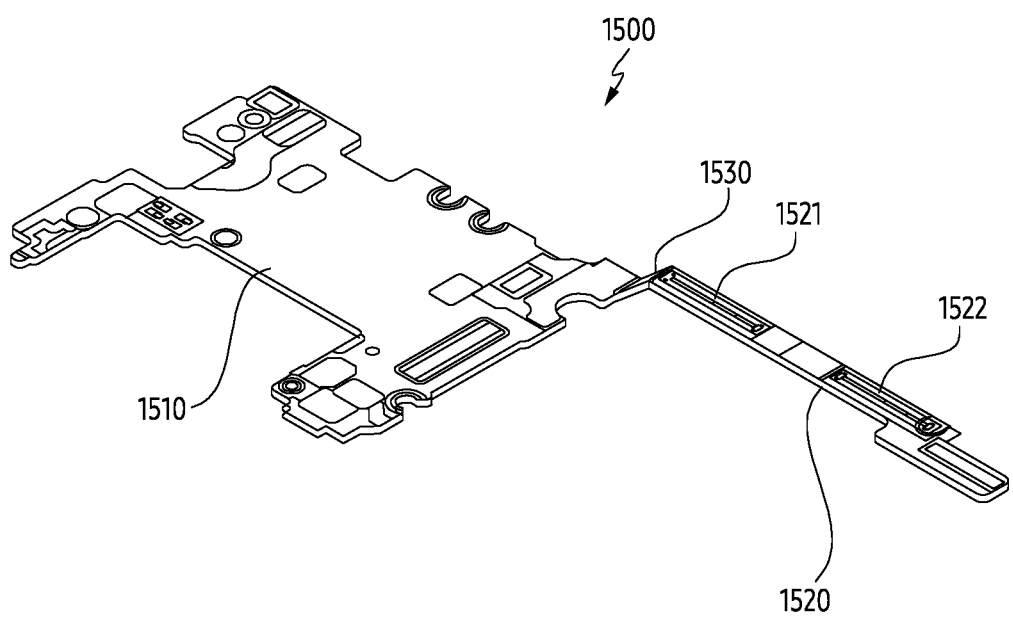
FIGS. 15A and 15B illustrate an arrangement of a printed circuit board and a sealing member according to various embodiments of the disclosure.
Figure 15B:
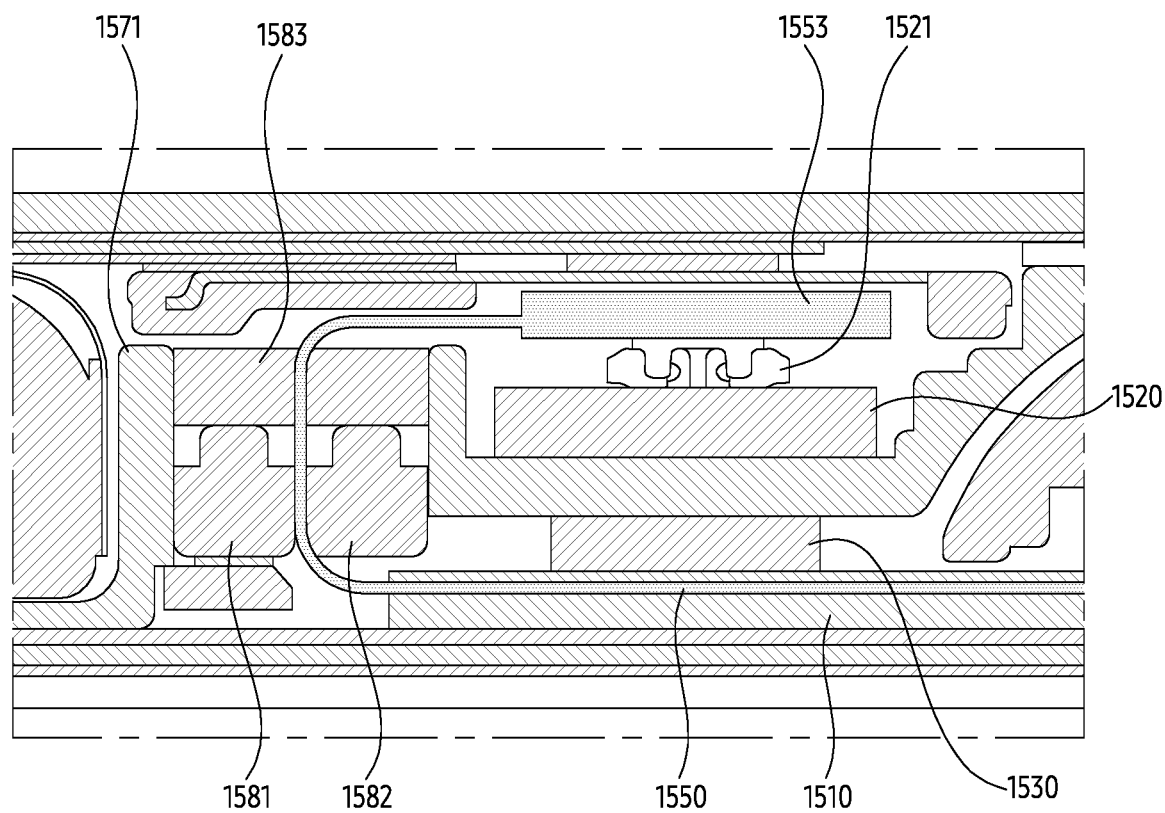

FIGS. 15A and 15B each illustrate arrangement of a printed circuit board and a sealing member according to various embodiments of the disclosure.

Referring to FIGS. 15A and 15B, a printed circuit board 1500 may include a body part 1510 and a neck part 1520. The neck part 1520 may extend from a portion of one edge of the body part 1510 in a direction away from the one edge, and may include a first connector 1521 and a second connector 1522.

According to an embodiment of the disclosure, the height of the body part 1510 and the neck part 1520 may be adjusted by a flexible substrate 1530. For example, the printed circuit board 1500 may include the body part 1510 and the neck part 1520 having rigidity, and it may be a rigid-flexible printed circuit board (R-FPCB) including the flexible substrate 1530 having flexibility.

The body part 1510 of the printed circuit board 1500 may be supported by a separate supporting member or supported by a supporting part extending from a side supporting member. The body part 1510 and the neck part 1520 of the printed circuit board 1500 may be disposed on the supporting member in the waterproof area. In order to compensate for the step difference between the printed circuit board 1500 and the sealing member, the flexible substrate 1530 may extend toward the rear surface of the electronic device. The extended flexible substrate 1530 may cause the neck part 1510 of the printed circuit board 1500 to be disposed at the height of the electronic device capable of maintaining the waterproof function with the first sealing member 1581, the second sealing member 1582, and a third sealing member 1583. The height of the neck part 1520 may be determined by the height of the sealing structure 1571. For example, the upper height of the neck part 1520 may be determined to have a height capable of minimizing bending of the flexible printed circuit board due to a step difference with an upper part of the sealing structure 1571 or an upper part of the third sealing member 1583.

According to an embodiment of the disclosure, a distance from one surface of the supporting member positioned between the printed circuit board 1500 and the display panel to the area where the flexible printed circuit board is positioned above the first connector may be longer than the distance by which the sealing structure 1571 extends upward from the one surface of the supporting member. As the length of the sealing structure 1571 increases, the waterproof performance can be enhanced, and adjusting the height of the neck part 1520 makes it possible to secure a sufficient height of the sealing member, thereby further improving the waterproof performance of the electronic device.

In the electronic device according to the above-described embodiment of the disclosure, in order to compensate for biasing of the printed circuit board toward the flexible display panel, the printed circuit board may be formed of R-FPCB, and its neck part 1520 with the first connector 1521 formed therein may be configured to be spaced from the flexible display panel, so as to minimize bending in a section in which the flexible printed circuit board 1550 extends from the sealing structure 1571 toward the first connector 1521. The first connector 1521 may be connected to the connector 1553 of the flexible printed circuit board 1550. Due to the minimized bending of the flexible printed circuit board 1550, it is possible to alleviate the concentration of stress onto the flexible printed circuit board 1550 and prevent damage to the flexible printed circuit board 1550.

According to an embodiment of the disclosure, an electronic device (e.g., an electronic device 101 of FIG. 1) is provided. The electronic device comprises a first housing (e.g., a first housing 210 of FIG. 2A) including a first surface (e.g., a first surface 211 of FIG. 2A) facing a first direction and a second surface (e.g., a second surface 212 of FIG. 2A) facing a second direction opposite to the first direction, a second housing (e.g., a second housing 220 of FIG. 2A) including a third surface (e.g., a third surface 221 of FIG. 2A) facing the first direction and a fourth surface (e.g., a fourth surface 222 of FIG. 2A) facing the second direction, a hinge structure (e.g., a hinge structure 260 of FIG. 2C) configured to provide an unfolded state in which the first surface and the third surface face the same direction or a folded state in which the first surface and the third surface face each other, by rotatably connecting the first housing and the second housing with respect to a folding axis (e.g., a folding axis 237 of FIG. 2A), a first printed circuit board (e.g., a first printed circuit board 251 of FIG. 2C) disposed in the first housing, a second printed circuit board (e.g., a second printed circuit board 252 of FIG. 2C) disposed in the first housing, laminated on one surface of the first printed circuit board facing the second direction and including a connector on the one surface facing the second direction; a flexible printed circuit board (e.g., a flexible printed circuit board 240 of FIG. 2C) connected with the connector, extending from the second housing through the hinge structure to the first housing, a rib supporting the first printed circuit board, disposed between the first printed circuit board and the first surface and including a through hole (e.g., the first opening 321 or an opening 327 of FIG. 3A) through which a part of the flexible printed circuit board passes, extending in the second direction from one surface of the rib, and at least one sealing member (e.g., sealing members 911 and 912 of FIG. 9C) for sealing a space between the through hole and the part of the flexible printed circuit board, wherein a first distance from one surface of the sealing member facing the second direction to the one surface of the first printed circuit board may be longer than a second distance from the one surface of the sealing member to one surface of the second printed circuit board facing the second direction According to an embodiment of the disclosure, the through hole may include a first sidewall (e.g., a first sidewall 751 of FIG. 9C) disposed along one periphery of the second printed circuit board, and a second sidewall (e.g., a second sidewall 751 of FIG. 9C) facing the first sidewall.

According to an embodiment of the disclosure, the sealing member may be disposed within the through hole and include a first sealing member sidewall (e.g., a first sealing member 911 of FIG. 9C) filling a space between the flexible printed circuit board and the first sidewall, and a second sealing member (e.g., a second sealing member 912 of FIG. 9C) filling a space between the flexible printed circuit board and the second sidewall.

According to an embodiment of the disclosure, the sealing member may include a third sealing member (e.g., an upper sealing member 930 of FIG. 9C) applied onto the first sealing member and the second sealing member and sealing a space between the flexible printed circuit board and the through hole by wrapping a part of the flexible printed circuit board.

According to an embodiment of the disclosure, the rib may include a supporting part protruding from an end of the second sidewall in contact with one surface of the rib into the through hole in a direction perpendicular to the first direction, wherein the second sealing member may be supported by the support.

According to an embodiment of the disclosure, the first sealing member may be fixed by a compressive force provided by the second sealing member, the flexible printed circuit board, and the through hole.

According to an embodiment of the disclosure, the electronic device may further include a battery, and the first printed circuit board may further include a body part (e.g., a body part 411 of FIG. 4) spaced apart from one periphery of the battery and a neck part (e.g., a neck part 412 of FIG. 4) having a width narrower than that of the body part, extending along the folding axis from one end of a periphery of the body part close to the folding axis and spaced apart from another periphery of the battery connected to one edge of the battery.

According to an embodiment of the disclosure, the second printed circuit board may include an area overlapping a portion of the body part and an area overlapping the neck part, wherein the area overlapping the portion of the body part may further include a plurality of conductive members transmitting a signal transferred to the connector to the first printed circuit board, and the connector may be disposed on the area overlapping the neck part.

According to an embodiment of the disclosure, the electronic device may further include a third printed circuit board (e.g., a third printed circuit board 520 of FIG. 5) disposed on at least part of the body part of the body part and the neck part, an interposer (e.g., an interposer 510 of FIG. 5) disposed between the first printed circuit board and the third printed circuit board and electrically connecting the first printed circuit board and the third printed circuit board, and a shield can (e.g., a shield can 530 of FIG. 5 530) disposed on one surface of the third printed circuit board facing the second direction, for shielding at least one component attached to the third printed circuit board from the outside, wherein the interposer may have a shape corresponding to a periphery of the third printed circuit board, and a distance from one surface of the first printed circuit board to the one surface of the third printed circuit board facing the second surface may be determined based on the thickness of the third printed circuit board, the interposer, and the shield can.

According to an embodiment of the disclosure, the flexible printed circuit board may correspond to a first flexible printed circuit board (e.g., a first flexible printed circuit board 430 of FIG. 4), the electronic device may further include a second flexible printed circuit board (e.g., a second flexible printed circuit board 440 of FIG. 4) distinct from the first flexible printed circuit board, the connector may correspond to a first connector (e.g., a fifth connector 418 of FIG. 4), the second printed circuit board may further include a second connector (e.g., a sixth connector 419 of FIG. 4) connected to the second flexible printed circuit board on an area of the second printed circuit board overlapping the neck part, the second connector being distinct and spaced apart from the first connector.

According to an embodiment of the disclosure, the through hole may correspond to a first through hole, the rib may further include a second through hole (e.g., a third opening 327 of FIG. 3A) distinct from the first through hole (e.g., a first opening 321 of FIG. 3A), the first through hole being spaced apart from one side of the first connector, wherein the second through hole may further include at least another sealing member configured to be spaced apart from a side of the first connector, surround a space through which the second flexible printed circuit board passes, and seal a space between the second through hole and the second flexible printed circuit board, the at least another sealing member being distinct from the at least one sealing member.

According to an embodiment of the disclosure, the electronic device may further include a third connector (e.g., a seventh connector 428 of FIG. 3A) distinct from the first connector, a fourth printed circuit board laminated on an edge area of the body part of one surface of the first printed circuit board facing the second direction, and the flexible printed circuit board may further include an extension having a certain width and extending to the third connector.

According to an embodiment of the disclosure, the rib may further include a third through hole (e.g., a through hole surrounded by a sealing structure 1050 of FIG. 11) distinct from the first through hole, wherein the third through hole may be spaced apart from a side of the third connector, surround a space through which a part of the extension passes, and include at least another sealing member (e.g., sealing members 1121 and 1122 of FIG. 11) configured to sealing a space between the third through hole and the extension, the at least another sealing member being distinct from the at least one sealing member.

According to an embodiment of the disclosure, the distance of the through hole extending from the one surface of the rib may be shorter than the distance extending by the second printed circuit board laminated on the first printed circuit board from the one surface of the rib to the area where the flexible printed circuit board is disposed above the connector.

According to an embodiment of the disclosure, the flexible printed circuit board may be configured to extend from the hinge structure along a space between the first surface and the rib to the through hole, in a third direction perpendicular to the second direction, bend into the space defined by the through hole, extend along the second direction from one end of the through hole to the other end portion, and bend from the other end of the through hole toward the connector to extend in a direction perpendicular to the second direction.

According to an embodiment of the disclosure, moisture may be introduced from the outside through a gap between the hinge structure and the first housing, via a path extending to the sealing member along a space between the rib and the first surface, and the sealing member may be configured to block the path through which the moisture is introduced into the first housing to prevent the transfer of the moisture to the connector, the first printed circuit board, and the second printed circuit board.

According to an embodiment of the disclosure, the distance from the one surface of the rib from which the through hole extends to one surface of the through hole toward the second direction may be determined based on the distance from the one surface of the supporting member from which the through hole extends, to one surface of the second printed circuit board toward the second direction.

According to an embodiment of the disclosure, the electronic device may further include a fifth printed circuit board (e.g., a fourth printed circuit board 420 of FIG. 4) electrically connected to the flexible printed circuit board and disposed within the second housing, a second rib distinct from a first rib when the rib corresponds to the first rib, supporting the fifth printed circuit board and including a fourth through hole (e.g., a second opening 322 of FIG. 3A) distinct from the first through hole, disposed between the fifth printed circuit board and the third surface, extending in the second direction from one surface, and surrounding a space through which the flexible printed circuit board passes, and at least another sealing member distinct from the at least one sealing member sealing a space between the fourth through hole and the flexible printed circuit board.

According to an embodiment of the disclosure, the electronic device may further include a sixth printed circuit board (e.g., a further printed circuit board 1260 of FIG. 12) within the second housing, laminated on one surface of the fifth printed circuit board facing the second direction and including a fourth connector (e.g., a second connector 762 of FIG. 12) distinct from the connector on one surface of the sixth printed circuit board facing the second direction, and the flexible printed circuit board may be connected to the fourth connector.

According to an embodiment of the disclosure, an electronic device (e.g., an electronic device 101 of FIG. 1) may comprise a first housing (e.g., a first housing 210 of FIG. 2A) including a first surface (e.g., a first surface 211 of FIG. 2A) facing a first direction and a second surface (e.g., a second surface 212 of FIG. 2A) facing a second direction opposite to the first direction, a second housing (e.g., a second housing 220 of FIG. 2A) including a third surface (e.g., a third surface 221 of FIG. 2A) facing the first direction and a fourth surface (e.g., a fourth surface 222 of FIG. 2A) facing the second direction, a hinge structure (e.g., a hinge structure 260 of FIG. 2C) configured to provide an unfolded state in which the first surface and the third surface face the same direction or a folded state in which the first surface and the third surface face each other, by rotatably connecting the first housing and the second housing with respect to a folding axis, a printed circuit board disposed within the first housing and including a first connector (e.g., a fifth connector 418 of FIG. 2C) on one surface of the printed circuit board facing the second direction, a flexible printed circuit board (e.g., a first flexible printed circuit board 430 of FIG. 4) extending from the second housing through the hinge structure to the first housing, and including a second connector (e.g., a first connector 431 of FIG. 4) connected to the first connector, a rib supporting the printed circuit board, being disposed between the printed circuit board and the first surface and including a through hole (e.g., a sealing structure 741 of FIG. 7) through which the flexible printed circuit board passes, the through hole extending in the second direction from one surface of the rib, and at least one sealing member (e.g., a sealing member 710 of FIG. 7) sealing a space between the through hole and the flexible printed circuit board, wherein the flexible printed circuit board may include an extension extending at a distance from the first connector in a third direction perpendicular to the second direction toward a periphery of the printed circuit board in the second housing, and the second connector disposed between the extension and the first connector, bending from the extension, wherein a distance from the one surface of the rib to the extension may be longer than an extending distance of the through hole from the one surface of the rib.

According to an embodiment of the disclosure, an electronic device (e.g., an electronic device 101 of FIG. 1) may comprise a first housing (e.g., a first housing 210 of FIG. 2A) including a first surface (e.g., a first surface 211 of FIG. 2A) facing a first direction and a second surface (e.g., a second surface 212 of FIG. 2A) facing a second direction opposite to the first direction, a second housing (e.g., a second housing 220 of FIG. 2A) including a third surface (e.g., a third surface 221 of FIG. 2A) facing the first direction and a fourth surface (e.g., a fourth surface 222 of FIG. 2A) facing the second direction, a hinge structure (e.g., a hinge structure 260 of FIG. 2C) configured to provide an unfolded state in which the first surface and the third surface face the same direction or a folded state in which the first surface and the third surface face each other, by rotatably connecting the first housing and the second housing with respect to a folding axis, a printed circuit board disposed within the first housing, including a first portion (e.g., a body part 1510 of FIG. 15A), a second portion (e.g., a flexible substrate 1530 of FIG. 15A) having ductility and extending along the folding axis from an end of an edge of the first portion close to the folding axis (e.g., a folding axis 237 of FIG. 2B) about which the first housing and the second housing are folded, the second portion having a width narrower than the width of the first portion, a third portion (e.g., a neck part 1520 of FIG. 15A) extending from an end of the second portion along the folding axis with the width of the second portion, and a first connector (e.g., a first connector 1521 of FIG. 15A) disposed on one surface of the third portion facing the second direction, a flexible printed circuit board including a second connector (e.g., a connector 1553) connected to the first connector and extending from the second housing through the hinge structure to the first housing, a rib supporting the printed circuit board, being disposed between the printed circuit board and the first surface and including a through hole (e.g., a sealing structure 1571 of FIG. 15B) through which the flexible printed circuit board passes, the through hole extending in the second direction from one surface of the rib, and at least one sealing member sealing a space between the through hole and a part of the flexible printed circuit board, and wherein a distance from the one surface of the rib to an area in which the flexible printed circuit board is located on the first connector may be longer than an extending distance of the through hole from the one surface of the rib.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may be interchangeably used with other terms, for example, "logic," "logic block," "part," or "circuitry". A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 140) including one or more instructions that are stored in a storage medium (e.g., an internal memory 136 or an external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment of the disclosure, a method according to various embodiments of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each component (e.g., a module or a program) of the above-described components may include a single entity or multiple entities, and some of the multiple entities may be separately disposed in different components. According to various embodiments of the disclosure, one or more of the above-described components may be omitted, or one or more other components may be added. Alternatively or additionally, a plurality of components (e.g., modules or programs) may be integrated into a single component. In such a case, according to various embodiments of the disclosure, the integrated component may still perform one or more functions of each of the plurality of components in the same or similar manner as they are performed by a corresponding one of the plurality of components before the integration. According to various embodiments of the disclosure, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a first housing including a first surface facing a first direction and a second surface facing a second direction opposite to the first direction;
   a second housing including a third surface facing the first direction and a fourth surface facing the second direction;
   a hinge structure configured to provide an unfolded state in which the first surface and the third surface face the same direction or a folded state in which the first surface and the third surface face each other, by rotatably connecting the first housing and the second housing with respect to a folding axis;
   a first printed circuit board disposed in the first housing;
   a second printed circuit board disposed in the first housing, laminated on one surface of the first printed circuit board facing the second direction and including a connector on the one surface facing the second direction;

a flexible printed circuit board connected with the connector, extending from the second housing through the hinge structure to the first housing;

a rib supporting the first printed circuit board, disposed between the first printed circuit board and the first surface and including a through hole through which a part of the flexible printed circuit board passes, extending in the second direction from one surface of the rib; and at least one sealing member for sealing a space between the through hole and the part of the flexible printed circuit board, wherein a first distance from one surface of the sealing member facing the second direction to the one surface of the first printed circuit board is longer than a second distance from the one surface of the sealing member to one surface of the second printed circuit board facing the second direction.

2. The electronic device of claim 1, wherein the through hole is configured to:
pass through the rib and have a certain length in the folding axis direction, and
includes a first sidewall disposed along one periphery of the second printed circuit board, and a second sidewall facing the first sidewall, and wherein the sealing member is disposed within the through hole and includes a first sealing member sidewall filling a space between the flexible printed circuit board and the first sidewall, and a second sealing member filling a space between the flexible printed circuit board and the second sidewall.

3. The electronic device of claim 2, wherein the sealing member further includes a third sealing member applied onto the first sealing member and the second sealing member and sealing a space between the flexible printed circuit board and the through hole by wrapping a part of the flexible printed circuit board.

4. The electronic device of claim 2, wherein the rib includes a supporting part protruding from an end of the second sidewall in contact with one surface of the rib into the through hole in a direction perpendicular to the first direction, and wherein the second sealing member is supported by the support.

5. The electronic device of claim 4, wherein the first sealing member is fixed by a compressive force provided by the second sealing member, the flexible printed circuit board, and the through hole.

6. The electronic device of claim 1, further comprising:
a battery, wherein the first printed circuit board further includes:
a body part spaced apart from one periphery of the battery, and
a neck part having a width narrower than that of the body part, extending along the folding axis from one end of a periphery of the body part close to the folding axis and spaced apart from another periphery of the battery connected to one edge of the battery.

7. The electronic device of claim 6, wherein the second printed circuit board includes an area overlapping a portion of the body part and an area overlapping the neck part, wherein the area overlapping the portion of the body part further includes a plurality of conductive members transmitting a signal transferred to the connector to the first printed circuit board, and wherein the connector is disposed on the area overlapping the neck part.

8. The electronic device of claim 6, further comprising:
a third printed circuit board disposed on at least part of the body part of the body part and the neck part;
an interposer disposed between the first printed circuit board and the third printed circuit board and electrically connecting the first printed circuit board and the third printed circuit board; and
a shield can disposed on one surface of the third printed circuit board facing the second direction, for shielding at least one component attached to the third printed circuit board from the outside, wherein the interposer has a shape corresponding to a periphery of the third printed circuit board, and wherein a distance from one surface of the first printed circuit board to the one surface of the third printed circuit board facing the second surface is determined based on a thickness of the third printed circuit board, the interposer, and the shield can.

9. The electronic device of claim 6, wherein the flexible printed circuit board corresponds to a first flexible printed circuit board, wherein the electronic device further includes a second flexible printed circuit board distinct from the first flexible printed circuit board, wherein the connector corresponds to a first connector, and wherein the second printed circuit board further includes a second connector connected to the second flexible printed circuit board on an area of the second printed circuit board overlapping the neck part, the second connector being distinct and spaced apart from the first connector.

10. The electronic device of claim 9, wherein the through hole corresponds to a first through hole, wherein the rib further includes a second through hole distinct from the first through hole, the first through hole being spaced apart from one side of the first connector, and wherein the second through hole further includes at least another sealing member configured to:
be spaced apart from a side of the first connector,
surround a space through which the second flexible printed circuit board passes, and
seal a space between the second through hole and the second flexible printed circuit board, the at least another sealing member being distinct from the at least one sealing member.

11. The electronic device of claim 10, further comprising:
a third connector distinct from the first connector; and
a fourth printed circuit board laminated on an edge area of the body part of one surface of the first printed circuit board facing the second direction, wherein the flexible printed circuit board further includes an extension having a certain width and extending to the third connector.

12. The electronic device of claim 11, wherein the rib further includes a third through hole distinct from the first through hole, and wherein the third through hole is spaced apart from a side of the third connector, surrounds a space through which a part of the extension passes, and includes at least another sealing member sealing a space between the third through hole and the extension, the at least another sealing member being distinct from the at least one sealing member.

13. The electronic device of claim 11, wherein a distance of the through hole extending from the one surface of the rib is shorter than a distance by which the second printed circuit board laminated on the first printed circuit board extends from the one surface of the rib to the area where the flexible printed circuit board is disposed on the connector.

14. The electronic device of claim 1, wherein the flexible printed circuit board is configured to:
   extend from the hinge structure along a space between the first surface and the rib to the through hole, in a third direction perpendicular to the second direction,
   bend into the space defined by the through hole, extend along the second direction from one end of the through hole to the other end portion, and
   bend from the other end of the through hole toward the connector to extend in a direction perpendicular to the second direction.

15. The electronic device of claim 1,
   wherein moisture is introduced from the outside through a gap between the hinge structure and the first housing, via a path extending to the sealing member along a space between the rib and the first surface, and
   wherein the sealing member is configured to block the path through which the moisture is introduced into the first housing to prevent transfer of the moisture to the connector, the first printed circuit board, and the second printed circuit board.

16. The electronic device of claim 4, wherein a distance from the one surface of the rib from which the through hole extends to one surface of the through hole toward the second direction is determined based on the distance from the one surface of the supporting part from which the through hole extends, to one surface of the second printed circuit board toward the second direction.

17. The electronic device of claim 1, further comprising:
   a fifth printed circuit board electrically connected to the flexible printed circuit board and disposed within the second housing;
   a second rib distinct from a first rib when the rib corresponds to the first rib, supporting the fifth printed circuit board and including a fourth through hole distinct from the first through hole, disposed between the fifth printed circuit board and the third surface, extending in the second direction from one surface, and surrounding a space through which the flexible printed circuit board passes; and
   at least another sealing member distinct from the at least one sealing member sealing a space between the fourth through hole and the flexible printed circuit board.

18. The electronic device of claim 17, further comprising:
   a sixth printed circuit board within the second housing, laminated on one surface of the fifth printed circuit board facing the second direction and including a fourth connector distinct from the connector on one surface of the sixth printed circuit board facing the second direction,
   wherein the flexible printed circuit board is connected to the fourth connector.

19. An electronic device comprising:
   a first housing including a first surface facing a first direction, and a second surface facing a second direction opposite to the first direction;
   a second housing including a third surface facing the first direction and a fourth surface facing the second direction;
   a hinge structure configured to provide an unfolded state in which the first surface and the third surface face the same direction or a folded state in which the first surface and the third surface face each other, by rotatably connecting the first housing and the second housing with respect to a folding axis;
   a printed circuit board disposed within the first housing and including a first connector on one surface of the printed circuit board facing the second direction;
   a flexible printed circuit board extending from the second housing through the hinge structure to the first housing, and including a second connector connected to the first connector;
   a rib supporting the printed circuit board, being disposed between the printed circuit board and the first surface and including a through hole through which the flexible printed circuit board passes, the through hole extending in the second direction from one surface of the rib; and
   at least one sealing member sealing a space between the through hole and the flexible printed circuit board,
   wherein the flexible printed circuit board includes an extension extending at a distance from the first connector in a third direction perpendicular to the second direction toward a periphery of the printed circuit board in the second housing, and the second connector disposed between the extension and the first connector, bending from the extension, and
   wherein a distance from the one surface of the rib to the extension is longer than an extending distance of the through hole from the one surface of the rib.

20. An electronic device comprising:
   a first housing including a first surface facing a first direction, and a second surface facing a second direction opposite to the first direction;
   a second housing including a third surface facing the first direction, and a fourth surface facing the second direction;
   a hinge structure configured to provide an unfolded state in which the first surface and the third surface face the same direction or a folded state in which the first surface and the third surface face each other, by rotatably connecting the first housing and the second housing with respect to a folding axis;
   a printed circuit board disposed within the first housing, including a first portion, a second portion having ductility and extending along the folding axis from an end of an edge of the first portion close to the folding axis about which the first housing and the second housing are folded, the second portion having a width narrower than the width of the first portion, a third portion extending from an end of the second portion along the folding axis with the width of the second portion, and a first connector disposed on one surface of the third portion facing the second direction;
   a flexible printed circuit board including a second connector connected to the first connector and extending from the second housing through the hinge structure to the first housing;
   a rib supporting the printed circuit board, being disposed between the printed circuit board and the first surface and including a through hole through which the flexible printed circuit board passes, the through hole extending in the second direction from one surface of the rib; and at least one sealing member sealing a space between the through hole and a part of the flexible printed circuit board, wherein a distance from the one surface of the rib to an area in which the flexible printed circuit board is located on the first connector is longer than an extending distance of the through hole from the one surface of the rib.

\* \* \* \* \*